United States Patent [19]
Unno et al.

[11] Patent Number: 5,517,461
[45] Date of Patent: May 14, 1996

[54] SEMICONDUCTOR STORAGE DEVICE HAVING LATCH CIRCUITRY COUPLED TO DATA LINES FOR ELIMINATING THROUGH-CURRENT IN SENSE AMPLIFIER

[75] Inventors: Kazuyoshi Unno, Kawasaki; Junichi Shikatani, Osaka; Takashi Maki, Kawasaki, all of Japan

[73] Assignee: Fujitsu Limited, Kawasaki, Japan

[21] Appl. No.: 237,304

[22] Filed: May 3, 1994

[30] Foreign Application Priority Data

Jun. 18, 1993  [JP]  Japan ................... 5-147271

[51] Int. Cl.$^6$ ................................. G11C 8/00
[52] U.S. Cl. ............... 365/233; 365/189.05; 365/230.03; 365/189.01
[58] Field of Search ................... 365/189.05, 230.03, 365/233, 203, 189.01, 210

[56] References Cited

U.S. PATENT DOCUMENTS

| | | | |
|---|---|---|---|
| 4,611,299 | 9/1986 | Hori et al. ........................... | 365/219 |
| 4,995,002 | 2/1991 | Yamada et al. ..................... | 365/189.01 |
| 5,043,944 | 8/1991 | Nakamura et al. ................. | 365/189.05 |
| 5,146,427 | 9/1992 | Sasaki et al. ....................... | 365/189.05 |
| 5,257,226 | 10/1993 | McClure ............................ | 365/189.09 |
| 5,260,903 | 11/1993 | Suyama et al. .................... | 365/189.05 |

FOREIGN PATENT DOCUMENTS

85/02485  6/1985  WIPO.

Primary Examiner—David C. Nelms
Assistant Examiner—Andrew Q. Tran
Attorney, Agent, or Firm—Staas & Halsey

[57] ABSTRACT

A semiconductor storage device includes a plurality of memory cells, a selecting circuit for selecting, in accordance with address information supplied from an external unit, a memory cell from among the plurality of memory cells, there being a case where a memory cell identified by the address information supplied from the external unit is not present in the plurality of memory cells, a data line to which the plurality of memory cells are coupled, data read out from the selected memory cell being transmitted through the data line, the data line being able to be in a floating state when a memory cell identified by address information is not present in the plurality of memory cells, an amplifier for amplifying the data transmitted through the data line, a latching circuit for latching a potential level of data which has been supplied to the data line, and a control circuit for controlling the latching circuit so that the latching circuit is inactive in a predetermined period including a time at which the data line receives data read out from the memory cell.

14 Claims, 23 Drawing Sheets

FIG. 25(A) CLK
FIG. 25(B) PRE-DECODER OUTPUT
FIG. 25(C) READING WORD LINE
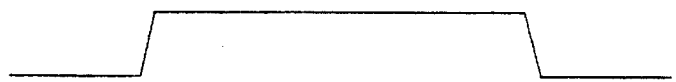
FIG. 25(D) READING BLOCK BIT LINE
FIG. 25(E) BCL
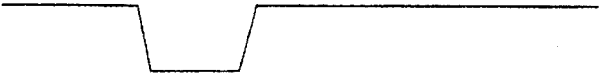
FIG. 25(F) READING MAIN BIT LINE
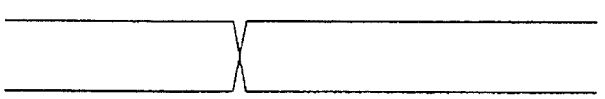
FIG. 25(G) MCL

SEMICONDUCTOR STORAGE DEVICE HAVING LATCH CIRCUITRY COUPLED TO DATA LINES FOR ELIMINATING THROUGH-CURRENT IN SENSE AMPLIFIER

BACKGROUND OF THE INVENTION (1) Field of the Invention

The present invention generally relates to a semiconductor storage device, and more particularly to a semiconductor storage device having a sense amplifier for amplifying data read out from a memory cell to a bit line (a data line), wherein the sense amplifier is made of a circuit, such as a CMOS inverter, through which a current does not steadily pass.

(2) Description of the Related Art

Conventionally, a semiconductor storage device, for example, of a static random access memory (SRAM) having a current detection type sense amplifier in which a differential amplifier is used has been known.

This current detection type sense amplifier has a superior driving function. Thus, even if bit lines are extended upon increasing of a chip area and capacity so that the wire load of the bit lines and gate load of transistors connected to the bit lines are increased, a reading operation can be carried out at a high speed.

However, a large amount of current steadily flows through a differential amplifier forming the current detection type sense amplifier. Thus, there is an disadvantage in that the dissipation power of the sense amplifier is increased.

On the other hand, a current does not steadily flow through a CMOS inverter formed of a P-MOS transistor and a n-MOS transistor in a case where an input thereof is either in a high level state (H) or in a low level state (L). Thus, if the sense amplifier is formed using the CMOS inverter, the dissipation power thereof can be reduced.

However, because the CMOS inverter has a poor driving function and the reading operation cannot be carried out at a high speed, the CMOS inverter is conventionally used as the sense amplifier of the SRAM having a small capacity but is not suitable for the SRAM having a large capacity.

In a case where the bit lines are extended upon increasing of the capacity of the SRAM, the memory matrix (the memory cell array) may be divided. That is, the bit lines may be divided. If each of the divided bit lines is provided with the CMOS inverter as the sense amplifier, the load for each sense amplifier can be decreased. Thus, in this case, even if the CMOS is used as the sense amplifier, the reading operation can be carried out at a high speed.

In recent years, SRAMs, in each of which the sense amplifier is formed of the CMOS inverter so that the dissipation power of the sense amplifier can be reduced, have been greatly developed.

Recently, the SRAM having the sense amplifier formed of the CMOS inverter has been proposed, as shown in FIG. 1.

Referring to FIG. 1, a chip body 1 (a SRAM body) has a memory matrix 2 in which memory cells are arranged, a address register 3 for receiving address signals supplied from an external unit, a row decoder 4, a word line buffer 5, a column decoder 6, a sense amplifier circuit 7, an output data buffer 8 for outputting data from the sense amplifier circuit 7 as output data Dout to an external unit, an input data register 9 for receiving input data Din supplied from an external unit, a write amplifier 10, a column selector 11, a clock buffer 12 for receiving a clock signal supplied from an external unit, a pulse generator 13 for generating a predetermined pulse signal based on the clock signal received by said clock buffer 12 and a WE register 14 for receiving a write enable signal WE used for the write control. A row address signal included in the address signal received by the address register 3 is decoded by the row decoder 4, and a word line selecting signal is output from the row decoder 4. The word line buffer 5 drives word lines arranged in the memory matrix 2 based on the word line selecting signal output from the row decoder 5. A column address signal included in the address signal received by the address register 3 is decoded by the column decoder 6, a column selecting signal being output from the column decoder 6. The sense amplifier 7 amplifies and outputs data in memory cells coupled to a column (a bit line) identified by the column selecting signal output from the column decoder 6, among memory cells identified by the same row address in the memory matrix 2. The input data Din received by the input data resister 9 is written in the memory matrix 2 by the write amplifier 10. In the writing operation, the column selector 11 selects a column (a bit line) based on the column selecting signal output from the column decoder 6.

Each of the memory cells in the SRAM shown in FIG. 1 is formed as shown in FIG. 2. Referring to FIG. 2, a memory cell is coupled to writing word lines WWL and /WWL, reading word lines RWL and /RWL, a writing bit line WBL, and a reading bit line RBL (/WWL and /RWL respectively represent $\overline{\text{WWL}}$ and $\overline{\text{RWL}}$ shown in figures). The memory cell has CMOS inverter 15, 16 and 17 and transmission gates 18, 19 and 20. The transmission gates 18, 19 and 20 are respectively formed of a set composed of a pMOS transistor 21 and an nMOS transistor 24, a set composed of a a pMOS transistor 22 and an nMOS transistor 25 and a set composed of a pMOS transistor 23 and an nMOS transistor 26.

In this memory cell, in the writing operation, the writing word line WWL is at a high level "H", the writing word line/WWL is at a low level "U", the reading word line RWL is at the low level "L" and the reading word line /RWL is at the high level "H", so that the transmission gate 18 is in an on state "ON" and the transmission gates 19 and 20 are in an off state "OFF".

In a case where data "H" having the high level is written in the memory cell, after the writing bit line WBL is made to be at the high level "H" so that a node 27 is changed to the high level "H" and a node 28 is changed to the low level "L", the writing word lines WWL and /WWL are respectively changed to the low level "L" and the high level "H", so that the transmission gate 18 is turned off (the off state "OFF") and the transmission gate 19 is turned on (the on state "ON"). As a result, the CMOS inverters 15 and 16 form a flip flop circuit, so that the nodes 27 and 28 are respectively at the high level "H" and the low level "L". That is, the data "H" having the high level is stored in the memory cell.

On the other hand, in a case where data "L" having the low level "L" is written in the memory cell, after the writing bit line WBL is made to be at the low level "L" so that the nodes 27 and 28 are respectively made to be at the low level "L" and the high level "H", the writing word lines WWL and /WWL are respectively turned to the low level "L" and the high level "H", so that the transmission gate 18 is turned off (the off state "OFF") and the transmission gate 19 is turned on (the on state "ON"). As a result, the CMOS inverter form a flip flop, so that the nodes 27 and 28 are respectively at the low level "L" and the high level "H". That is, the data "U" having the low level is stored in the memory cell.

In addition, in the reading operation, the writing word line WWL is at the low level "L", the writing word line /WWL is at the high level "H", the reading word line RWL is at the high level "H" and the reading word line /RWL is at the low level "L", so that the transmission gate 18 is in the off state "OFF" and the transmission gates 19 and 20 are in the on state "ON". As a result, the memory cell in the reading operation can be represented by an equivalent circuit as shown in FIG. 3. In this case, when the data "H" having the high level is written in the memory cell, that is, when the nodes 27 and 28 are respectively at the high level "H" and the low level "U" as shown in FIG. 4, the reading bit line RBL is at the high level "H". On the other hand, when the data "L" having the low level is written in the memory cell, that is, when the nodes 27 and 28 are respectively at the low level "L" and the high level "H" as shown in FIG. 5, the reading bit line RBL is at the low level "L".

In the SRAM having the above structure, if each row address signal has n bits, a set of row address memory cells can be identified by each row address signal among $2^n$ sets of row address memory cells. If only $2^i$ (i is less than n) sets of row address memory cells are actually included in the memory matrix 2, there may be a case where a set of row address memory cells identified by a row address signal is not included in the memory matrix 2, since the number ($2^n$) of sets of row address memory cells which can be identified by the row address having n bits is greater than the number ($2^i$) of sets of row address memory cells actually included in the memory matrix 2. In this case, the following problem occurs.

The sense amplifier 7 is formed of a CMOS inverter as shown in FIG. 6. That is, the CMOS inverter is formed of a pMOS transistor 29 and a nMOS transistor 30 both of which are serially connected to each other between a high voltage power line VCC and a low voltage power line VSS. If a row address signal identifying a set of row address memory cells which is not included in the memory matrix 2 is supplied to the memory matrix 2, the reading bit line RBL connected to the sense amplifier 7 is in a floating state. As a result, a current $I_A$ passes through the CMOS inverter forming the sense amplifier 7, as shown in FIG. 6. This current $I_A$ is referred to as a through current. This through current $I_A$ causes the dissipation power to be increased, the deterioration of characteristics of the transistors to be accelerated, the DC test to be disturbed and the like. As a result, the above described advantages of using the CMOS inverter as the sense amplifier are canceled.

To solve the above problem, it may be proposed that a bus driver stack circuit, which is a kind of latch circuit, is connected to the reading bit line RBL, as shown in FIG. 7.

Referring to FIG. 7, memory cells 31 and 32, which are identified by different row address, are connected to the reading bit line RBL. A CMOS inverter 33 forming the sense amplifier 7 and a bus driver stack circuit 34 formed of CMOS inverters 35 and 36 are also connected to the reading bit line RBL. The bus driver stack circuit 34 controls the reading bit line RBL so that the reading bit line RBL is maintained at either the high level "H" or the low level "L" even if a row address identifying a set of row address memory cells which are not included in the memory matrix 2 is supplied to the memory matrix 2. That is, the reading bit line RBL is always maintained in a state which is not the floating state. As a result, no through current $I_A$ pass through the CMOS inverter 33.

If the data "H" having the high level is read, for example, from the memory cell 31, the outputs of the CMOS inverters 35 and 36 of the bus driver stack circuit 34 are respectively at the low level "L" and the high level "H" so that an input/output node 37 in the bus driver stack circuit 34 is fixed at the high level "H". As result, until the next reading operation is performed, the reading bit line RBL is maintained at the high level "H". On the other hand, if the data "L" having the low level is read from the memory cell 31, the outputs of the CMOS inverters 35 and 36 are respectively at the high level "H" and the low level "L" so that the input/output node 37 is fixed at the low level "L". As a result, until the next reading operation is performed, the reading bit line RBL is maintained at the low level "L".

As has been described above, in a case where the bus driver stack circuit 34 is used, the reading bit line RBL can be always maintained at either the high level "H" or the low level "L". Thus, even if a row address signal identifying a set of row address memory cells which are not included in the memory matrix 2 is supplied to the memory matrix 2, the reading bit line RBL is not in the floating sate, so that the through current $I_A$ does not pass through the CMOS inverter 33 forming the sense amplifier 7.

However, the SRAM having the bus driver stack circuit 34 as shown in FIG. 7, when the data "H" is read out from the memory cell 31 so that the reading bit line RBL is maintained at the high level "H" and the data "L" is then read out from the memory cell 32, a new problem occurs.

This problem will be described below with reference to FIG. 8. Referring to FIG. 8, the memory cell 32 is formed of CMOS inverter 38, 39 and 40 which correspond to the CMOS inverter 15, 16 and 17 shown in FIG. 2. The CMOS inverter 40 is formed of a pMOS transistor 41 and an nMOS transistor 42, and the CMOS inverters 38 and 39 have the same structure as the CMOS inverter 40. Transmission gates corresponding to the transmission gates 18, 19 and 20 shown in FIG. 2 are omitted from the FIG. 8. In the bus driver stack circuit 34, the CMOS inverter 36 is formed of a pMOS transistor 43 and an nMOS transistor 44, and the CMOS inverter 35 has the same structure as the CMOS inverter 36.

If the reading bit line RBL is maintained at the high level "H", in the bus driver stack circuit 34, the output of the CMOS inverter 35 is at the low level "L" so that the pMOS transistor 43 is in the on state "ON" and the nMOS transistor 44 is in the off state "OFF". IN addition, if data "L" is stored in the memory cell 32, nodes 45 and 46 in the memory cell 32 are respectively at the low level "L" and the high level "H" so that the pMOS transistor 41 is in the off state "OFF" and the nMOS transistor 42 is in the on state "ON". Thus, in a case where the data "L" is read out from the memory cell 32, a current $I_B$ flows from the reading bit line RBL to the low voltage power line VSS through the nMOS transistor 42 in the memory cell 32, so that the level of the reading bit line RBL is decreased down from the high level "H" to the low level "L". In this case, a current $I_C$ is supplied from the high voltage power line VCC to the reading bit line RBL through the pMOS transistor 43 in the bus driver stack circuit 34. As a result, a time needed to decrease the level of the reading bit line RBL from the high level "H" to the low level "L" is increased.

In addition, when the data "U" is read out from the memory cell 31 so that the reading bit line RBL is maintained at the low level "L" and the data "H" is then read out from the memory cell 32, the same problem occurs.

This problem will be described below with reference to FIG. 9. Referring to FIG. 9, if the reading bit line RBL is maintained at the low level "L", in the bus driver stack circuit 34, the output of the CMOS inverter 35 is at the high level "H" so that the pMOS transistor 43 is in the off state "OFF" and the nMOS transistor is in the on state "ON". In addition, if the data "H" is stored in the memory cell 32, the nodes 45 and 46 in the memory cell 32 are respectively at the high level "H" and the low level "L" so that the pMOS transistor 41 is in the on state "ON" and the nMOS transistor 42 is in the off state "OFF". Thus, when the data "H" is read out from the memory cell 32, a current $I_D$ is supplied from the high voltage power line VCC to the reading bit line RBL through the pMOS transistor 41 in the memory cell 32, so that the level of the reading bit line RBL is pulled up from the low level "U" to the high level "H".

However, in this case, a current $I_E$ flows from the reading bit line RBL to the lower voltage power line VSS through the nMOS transistor in the bus driver stack circuit 34. As a result, a time needed to pull up the level of the reading bit line RBL from the low level "L" to the high level "H" is increased.

As has been described above, in the SRAM provided with the bus driver stack circuit 34 as shown in FIG. 7, when data having a potential level opposite to the potential level at which the read bit line RBL is maintained by the bus driver stack circuit 34 is read out from a memory cell, a time which is needed to invert the potential level of the read bit line RBL is increased. As a result, a reading rate cannot be increased.

In addition, in the SRAM as shown in FIG. 7, the output potential level of the memory cell 32 must exceed the output potential level of the CMOS inverter 36 in the bus driver stack circuit 34 so that a threshold voltage condition of the CMOS inverter 33 is satisfied. Thus, the margins of production process conditions of the SRAM and the operating margin of the SRAM with respect to a power voltage are narrow.

SUMMARY OF THE INVENTION

Accordingly, a general object of the present invention is to provide a novel and useful semiconductor storage device in which the disadvantages of the aforementioned prior art are eliminated.

A more specific object of the present invention is to provide a semiconductor storage device in which the reading rate can be increased, the semiconductor device having an amplifier for amplifying data read out from a selected memory cell to a bit line, which amplifier is formed of a circuit, such as a CMOS inverter.

The above objects of the present invention are achieved by a semiconductor storage device comprising a plurality of memory cells; selecting means for selecting, in accordance with address information supplied from an external unit, a memory cell from among the plurality of memory cells, there being a case where a memory cell identified by the address information supplied from the external unit is not present in the plurality of memory cells; a data line to which the plurality of memory cells are coupled, data read out from the memory cell selected by the selecting means being transmitted through the data line, the data line being able to be in a floating state when a memory cell identified by address information is not present in the plurality of memory cells; an amplifier, coupled to the data line, for amplifying the data transmitted through the data line; a latching circuit, coupled to the data line, for latching a potential level of data which has been supplied to the data line; and control means, coupled to the latching means, for controlling the latching means so that the latching circuit is inactive in a predetermined period of time which includes a time when the data line receives data read out from the memory cell.

According to the present invention, the latch circuit is inactive in the predetermined period including a time at which the data line receives the data read out from the memory cell. Thus, even if data having a potential level opposite to a potential level latched by the latch circuit is supplied to the data line, a current can be prevented from flowing between the latch circuit and the data line. That is, the potential level of the data line can be rapidly changed when data having a potential level opposite to a potential level latched by the latch circuit is supplied to the data line. As a result, the reading rate can be increased.

Additional objects, features and advantages of the present invention will become apparent from the following detailed description when read in conjunction with the accompanying drawings.

BRIEF DESCRIPTION OF THE DRAWINGS

FIGS. 25(A)–(G) are timing charts illustrating operations of the SRAM shown in FIG. 10.

DESCRIPTION OF THE PREFERRED EMBODIMENTS

A description will now be given, with reference to FIGS. 10–25, of an embodiment of the present invention. In the embodiment, the present invention is applied to an SRAM.

Figure 10:
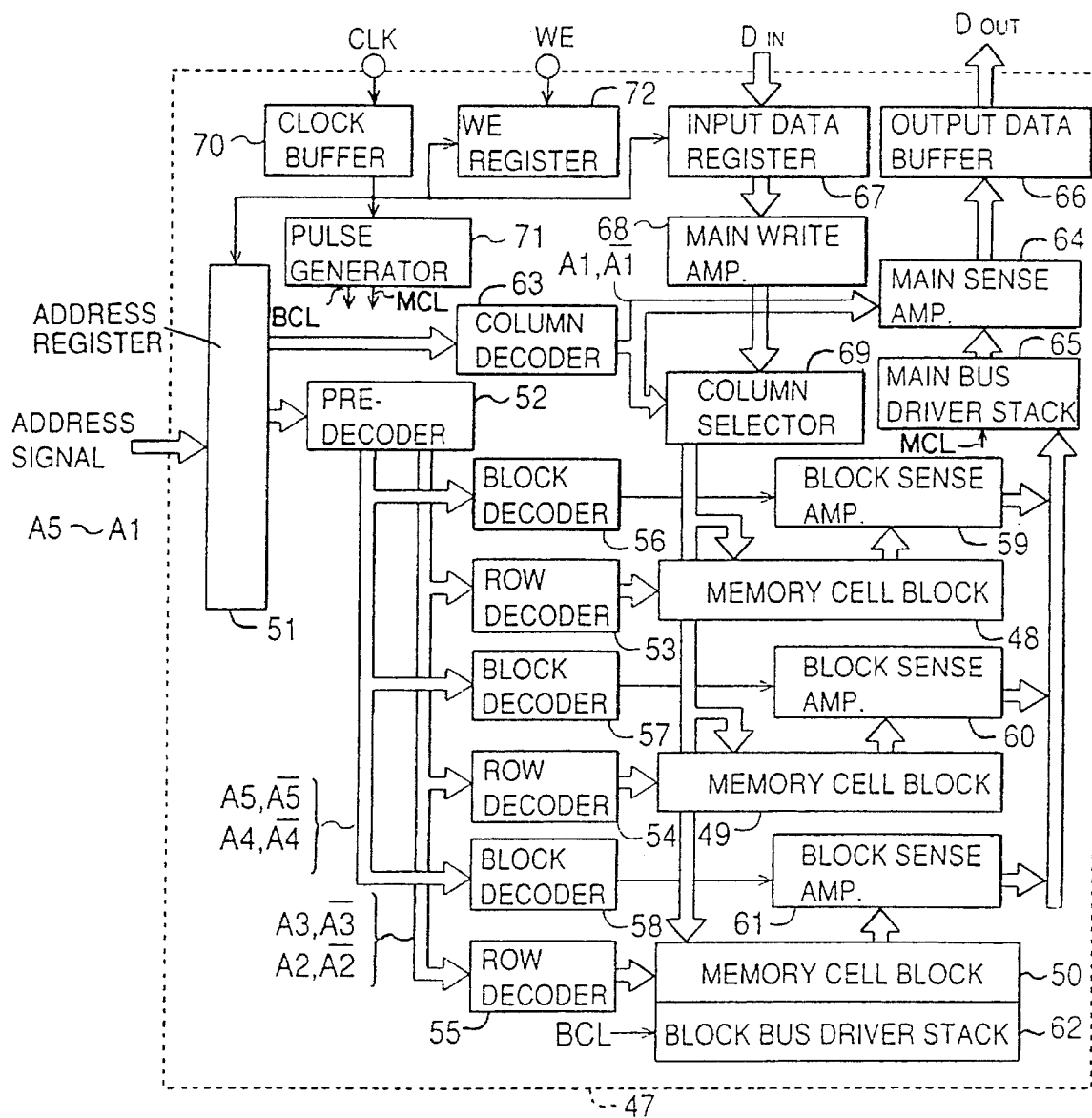
FIG. 10 is a block diagram illustrating a semiconductor storage device (SRAM) according to an embodiment of the present invention.

FIG. 10 shows an essential part of an SRAM according to the embodiment of the present invention. The SRAM shown in FIG. 10 has a physical size of 9 words and 4 bits, and a theoretical size of 18 words and 2 bits. Referring to FIG. 10, a chip body 47 has memory cell blocks 48, 49 and 50, an address register 51, a pre-decoder 52, row decoders 53, 54 and 55, block decoders 56, 57 and 58, block sense amplifiers 59, 60 and 61, a block bus driver stack circuit 62, a column decoder 63, a main sense amplifier 64, a main bus driver stack circuit 65, an output data buffer 66, an input data register 67, a main write amplifier 68, a column selector 69, a clock buffer 70, a pulse generator 71 and a WE register 72.

Each of the memory cell blocks 48 and 49 has a capacity corresponding to the physical size of 4 words and 4 bits. The memory cell block 50 has a capacity corresponding to the physical size of 1 word and 4 bits. The address register 51 receives an address signal having 5 bits A5, A4, A3, A2 and A1 supplied from an external unit. The bits A5 and A4 are used as a block address signal for identifying a block address to be selected, bits A3 and A2 are used as a row address signal for identifying a row address to be selected, and a bit A1 is used as a column address signal for identifying a column address to be selected. The pre-decoder 52 pre-decodes the block address signal (A5 and A4) and the row address signal (A3 and A2) included in the address signal (A5, A4, A3, A2 and A1), and outputs a block address signal (A5, /A5, A4 and /A4) having a complementary form and a row address signal (A3, /A3, A2 and /A2) having a complementary form. Each of the row decoders 53, 54 and 55 decodes a row address signal (A3, /A3, A2 and /A2) supplied from the pre-decoder 52 and outputs a word line selecting signal. Each of the block decoder 56, 57 and 58 decodes a block address signal (A5, /A5, A4 and /A4) supplied from the pre-decoder 52 and outputs a block selecting signal.

The block sense amplifiers 59, 60 and 61 are respectively coupled to the memory cell blocks 48, 49 and 50, and each of the block sense amplifiers 59, 60 and 61 amplifies data read out from a corresponding one of the memory cell blocks 48, 49 and 50. The block bus driver stack circuit 62 is operatively coupled to the block sense amplifier 61 so that a current does not steadily flow in a buffer circuit forming the block sense amplifier 61. The column decoder 63 decodes a column address signal (A1) included in the address signal (A5, A4, A3, A2 and A1) received by the address register 51, and outputs a column selecting signal (A1 and /A1). The main sense amplifier 64 amplifies data from a memory cell, among memory cells identified by a row address in one of the memory cell blocks 48, 49 and 50, in a column identified by a column selecting signal (A1 and /A1) output from the column decoder 63. The main bus driver stack circuit 65 is operatively coupled to the main sense amplifier 64 so that a current does not steadily flow in a buffer circuit forming the main sense amplifier 64. Data output from the main sense amplifier 64 is set as output data $D_{out}$ in the output data buffer 66. The input data register 67 receives data supplied from an external unit as input data $D_{in}$. The write amplifier 68 writes the input data $D_{in}$ to a selected memory cell in each of the memory cell blocks 48, 49 and 50. The column selector 69 selects a column in each of the memory cell blocks 48, 49 and 50 based on the column selecting signal (A1 and /A1) output from the column decoder 63 in the writing operation.

The clock buffer 70 receives a clock signal CLK supplied from an external unit. The pulse generator 71 generates, based on the clock signal CLK received by the clock buffer 70, pulse signals, such as a block bus driver stack control signal BCL used to control the block bus driver stack circuit 62 and a main bus driver stack control signal MCL used to control the main bus driver stack circuit 65. The WE register receives the write enable signal WE used to control the writing operation.

Figure 11:
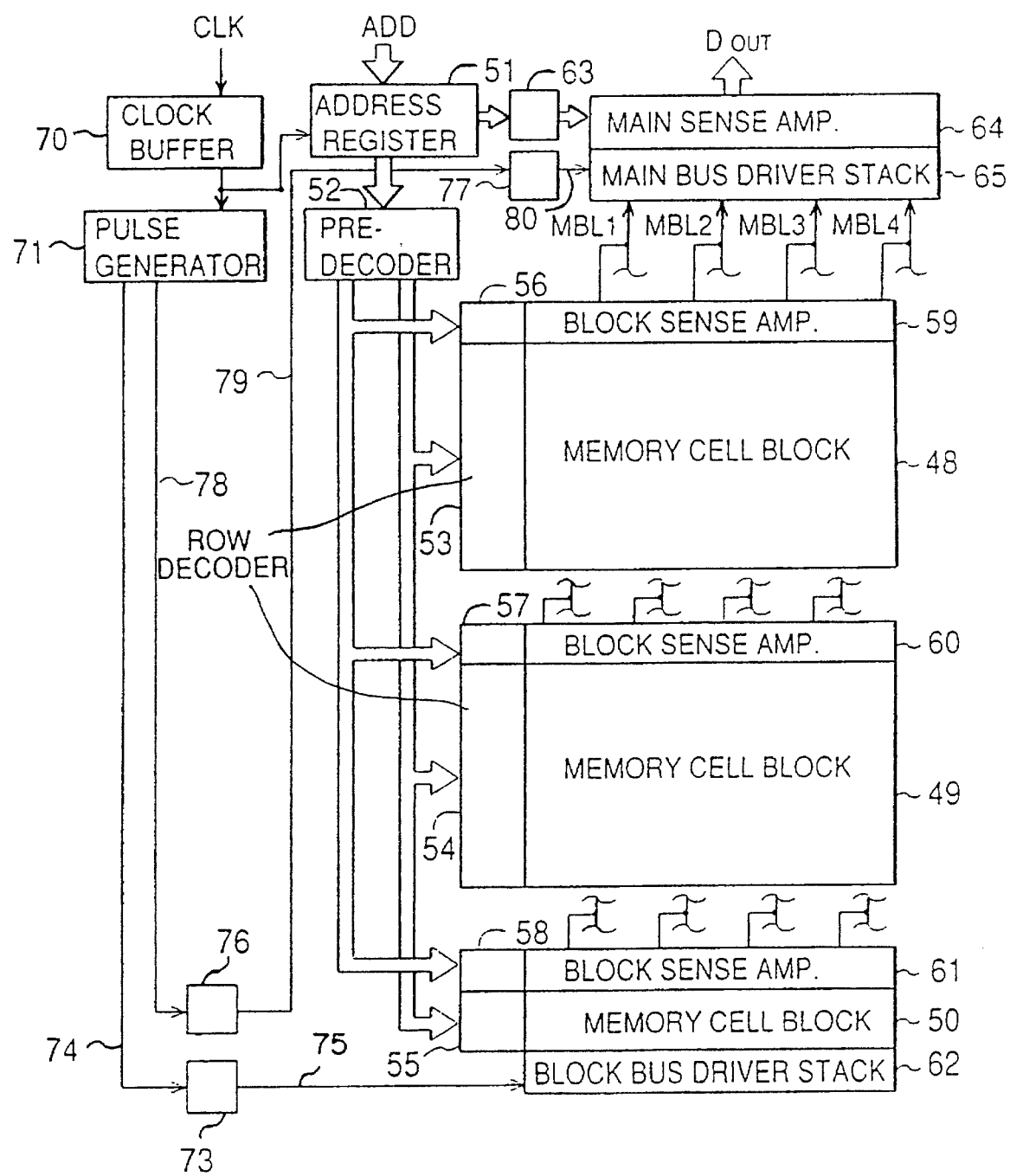
FIG. 11 is a block diagram illustrating in detail a part of the semiconductor storage device shown in FIG. 10.

FIG. 11 shows in detail a part of the SRAM shown in FIG. 10, from a standpoint of the reading operation.

Referring to FIG. 11, a block control buffer 73 is provided for the block bus driver stack control signal BCL, the pulse generator 71 and the block control buffer 73 are connected by a block bus driver stack control signal line 74, and the block control buffer 73 and the block bus driver stack circuit 62 are connected by a block bus driver stack control signal line 75. In addition, main control buffers 76 and 77 are provided for the main bus driver stack control signal MCL, the pulse generator 71 and the main control buffer 76 are connected by a main bus driver stack signal line 78, the main control buffers 76 and 77 are connected by a main buffer driver stack signal line 79, and the main control buffer 77 and the main bus driver stack circuit 65 are connected by a main bus driver stack signal line 80. Main bit lines MBL1, MBL2, MBL3 and MBL4 are shared by the memory cell blocks 48, 49 and 50.

Figure 12:
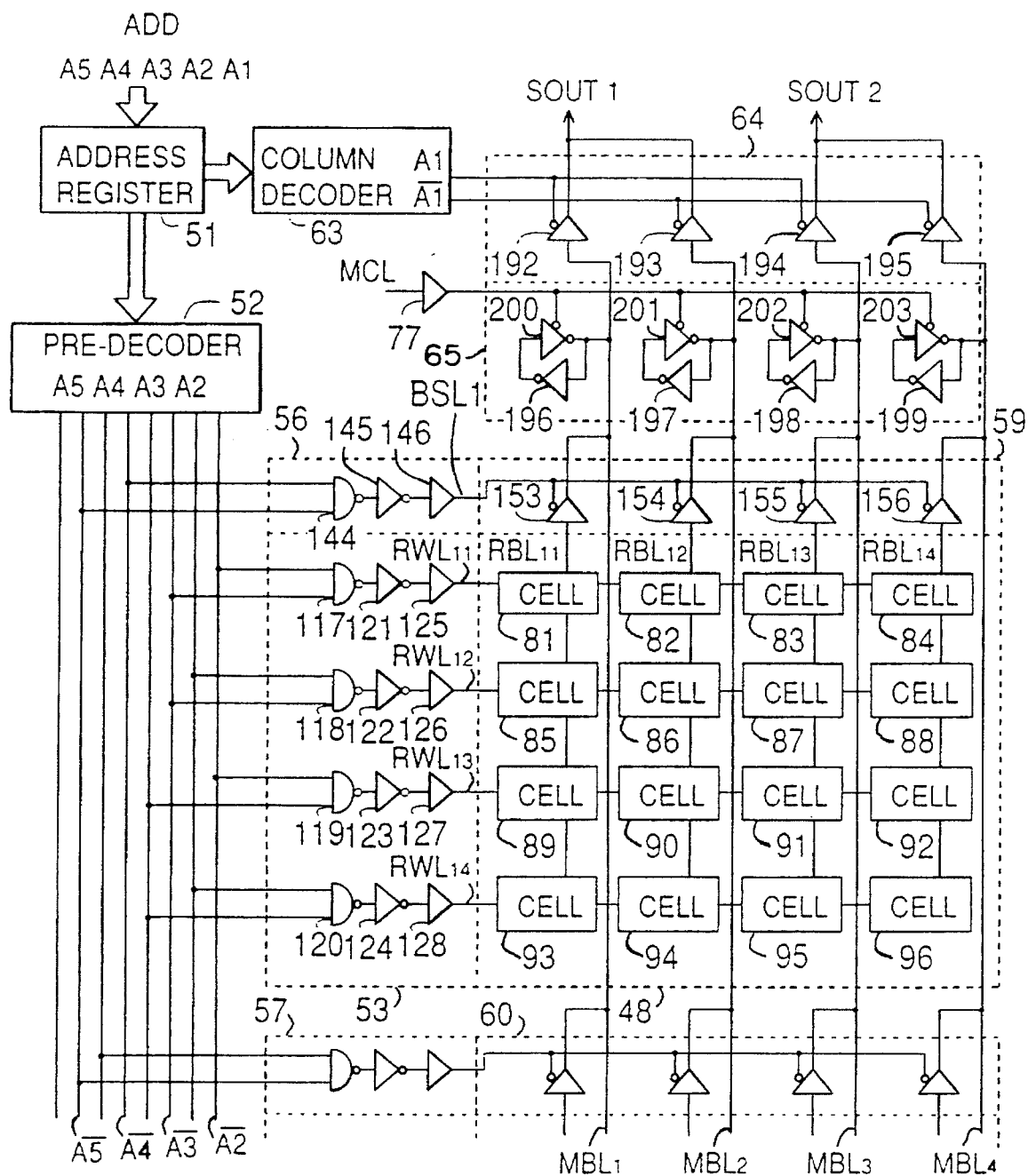
FIG. 12 is a circuit diagram illustrating in detail a part of the semiconductor device shown in FIG. 10.

FIG. 12 shows in detail a part of the SRAM shown in FIG. 10, from a standpoint of the reading operation, which part includes the memory cell block 48, the row decoder 53, the block decoder 56, the block sense amplifier 59, the main sense amplifier 64 and the main bus driver stack circuit 65.

Figure 13:
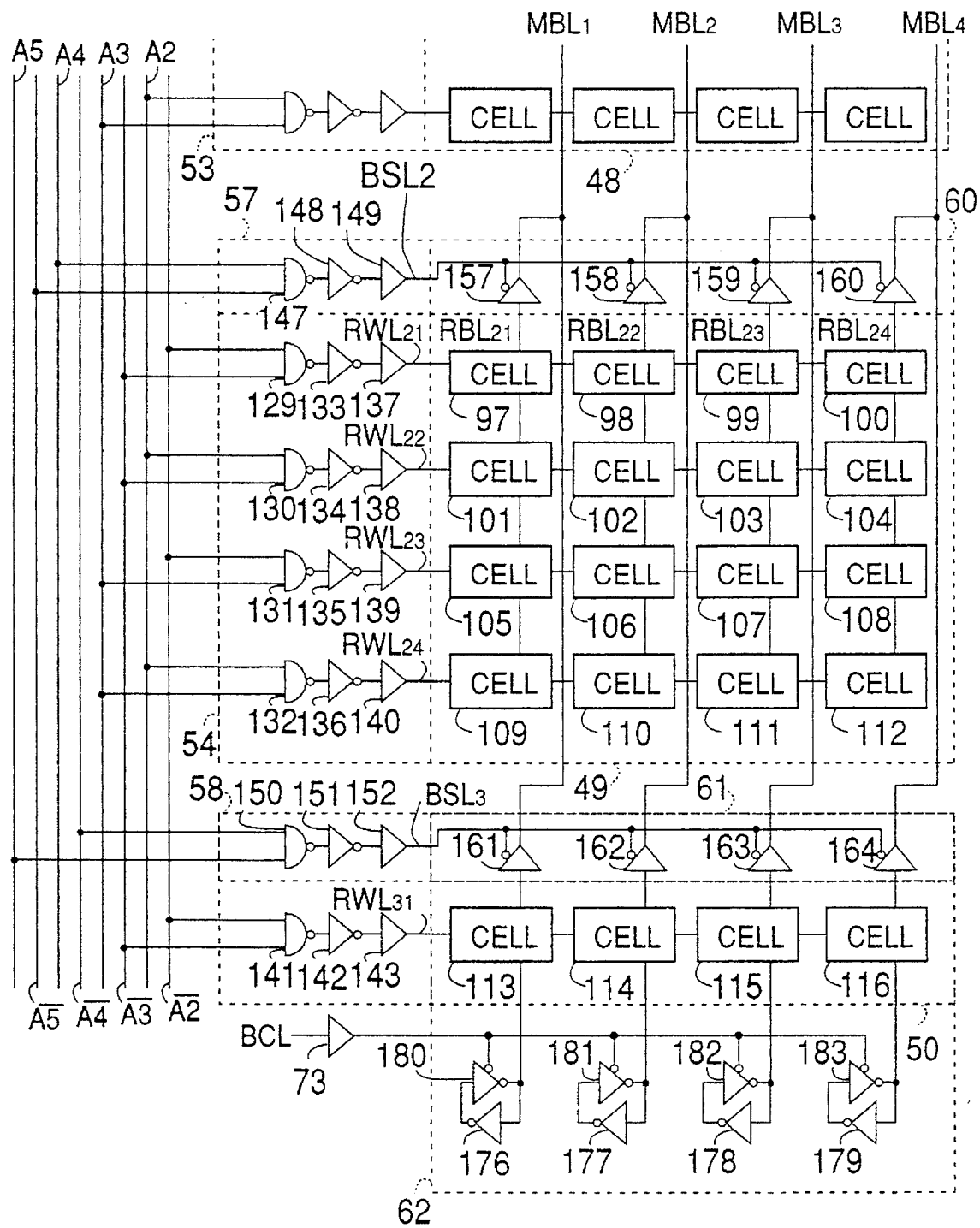
FIG. 13 is a circuit diagram illustrating in detail a part of the semiconductor device shown in FIG. 10.

FIG. 13 shows in detail a part of the SRAM show in FIG. 10, from a standpoint of the reading operation, which part includes the memory cell blocks 49 and 50, the row decoders 54 and 55, the block decoders 57 and 58, the block sense amplifiers 60 and 61 and the block bus driver stack circuit 63.

The memory cell block 48 shown in FIG. 12 has memory cells 81–96, reading word lines $RWL_{11}$–$RWL_{14}$, and reading block bit lines RBL11–$RBL_{14}$. The memory cell 49 shown in FIG. 13 has memory cells 97–112, reading word lines $RWL_{21}$–$RWL_{24}$, and reading block bit lines $RBL_{21}$–$RBL_{24}$. The memory cell block 50 shown in FIG. 13 has memory cells 113–116, a reading word line $RWL_{31}$ and reading block bit lines $RBL_{31}$–$RBL_{34}$.

Figure 1:
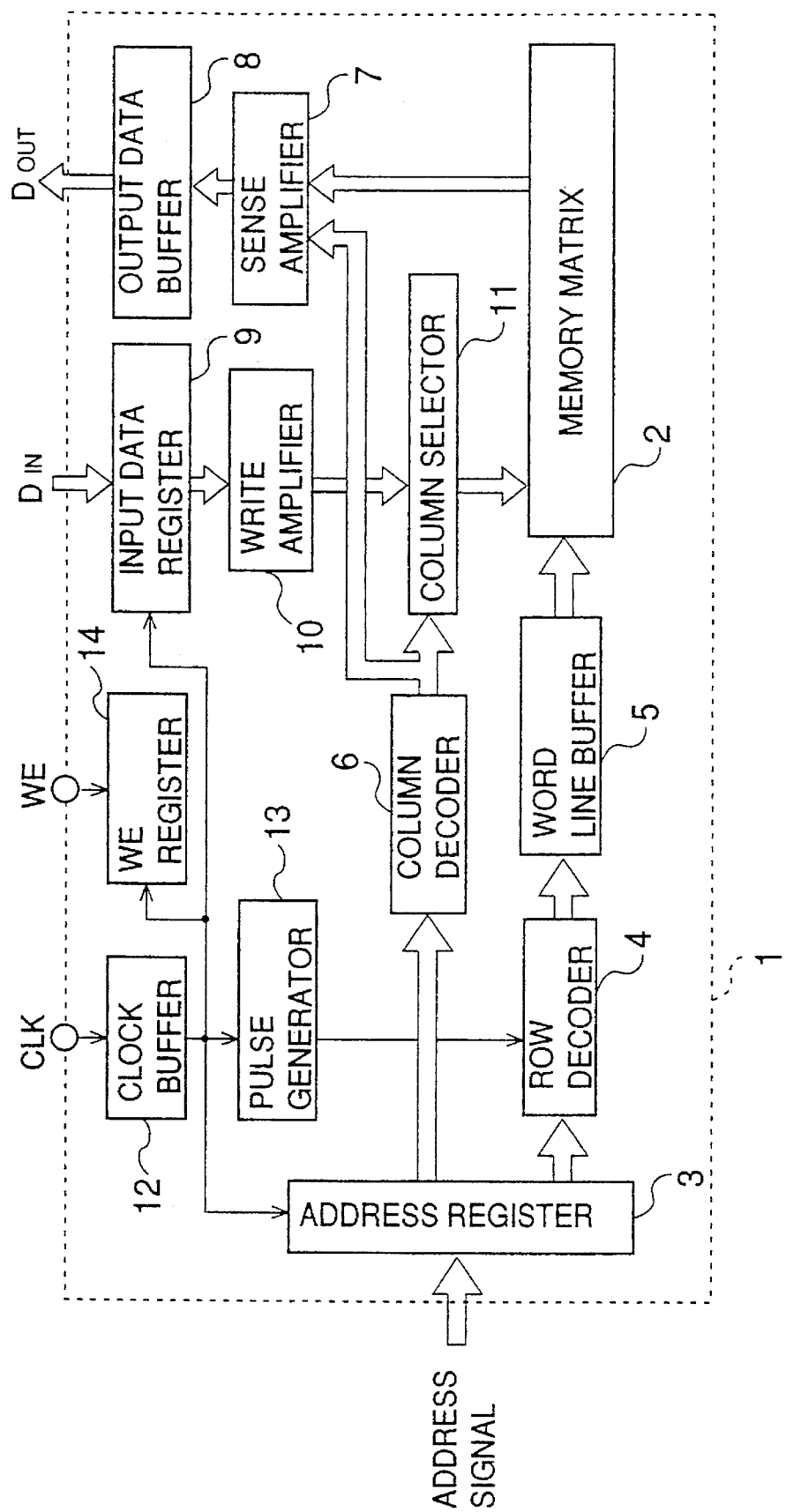
FIG. 1 is a block diagram illustrating a conventional SRAM.
Figure 2:
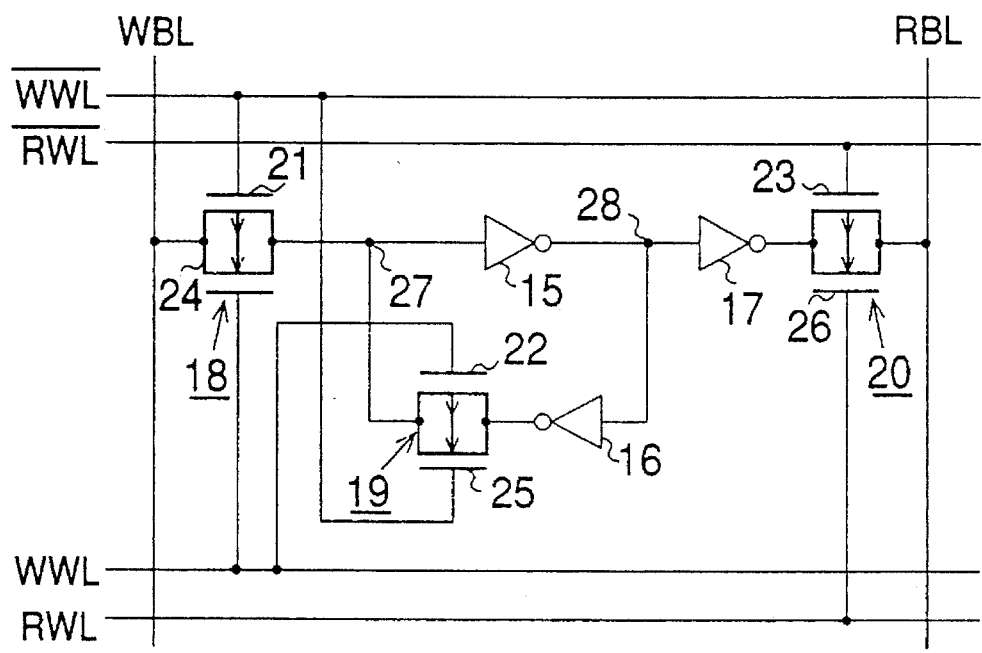
FIG. 2 is a circuit diagram illustrating a memory cell provided in the SRAM shown in FIG. 1.
Figure 3:
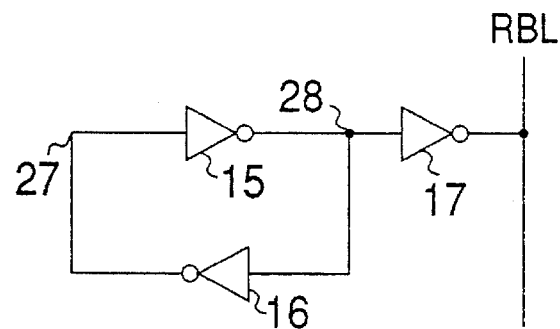
FIG. 3 is an equivalent circuit diagram illustrating the memory cell shown in FIG. 2 in a reading operation.
Figure 4:
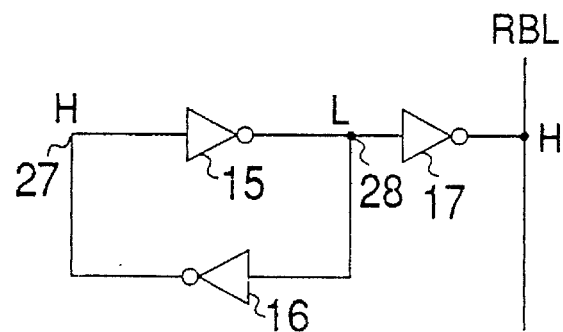
FIG. 4 is a circuit diagram illustrating a state of the memory cell shown in FIG. 2 in the reading operation, in which memory cell data "H" is stored.
Figure 5:
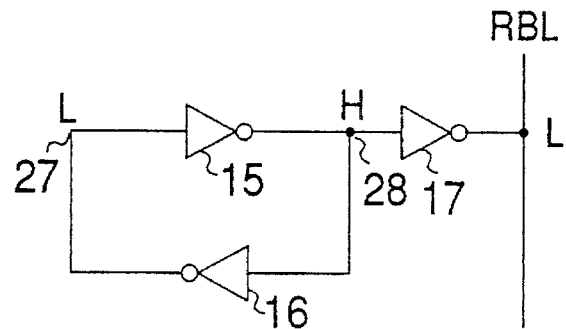
FIG. 5 is a circuit diagram illustrating a state of the memory cell shown in FIG. 2 in the reading operation, in which memory cell data "L" is stored.
Figure 6:
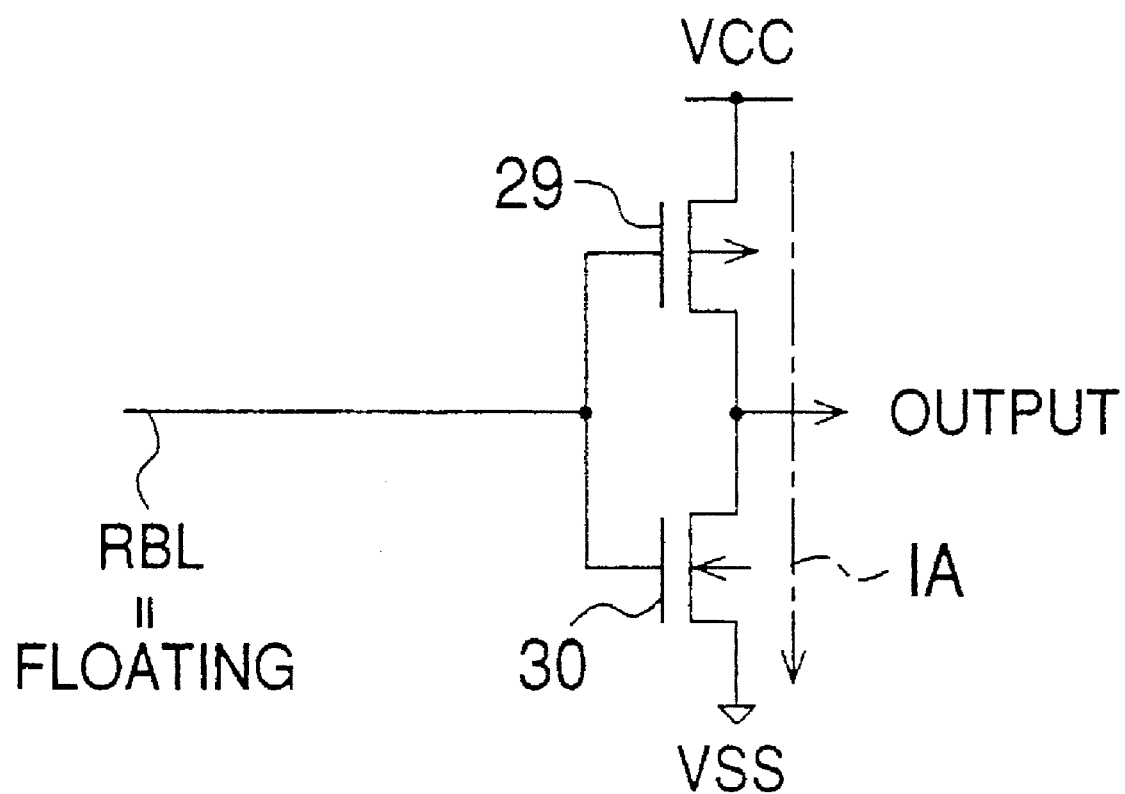
FIG. 6 is a circuit diagram illustrating a problem of the conventional SRAM shown in FIG. 1.
Figure 7:
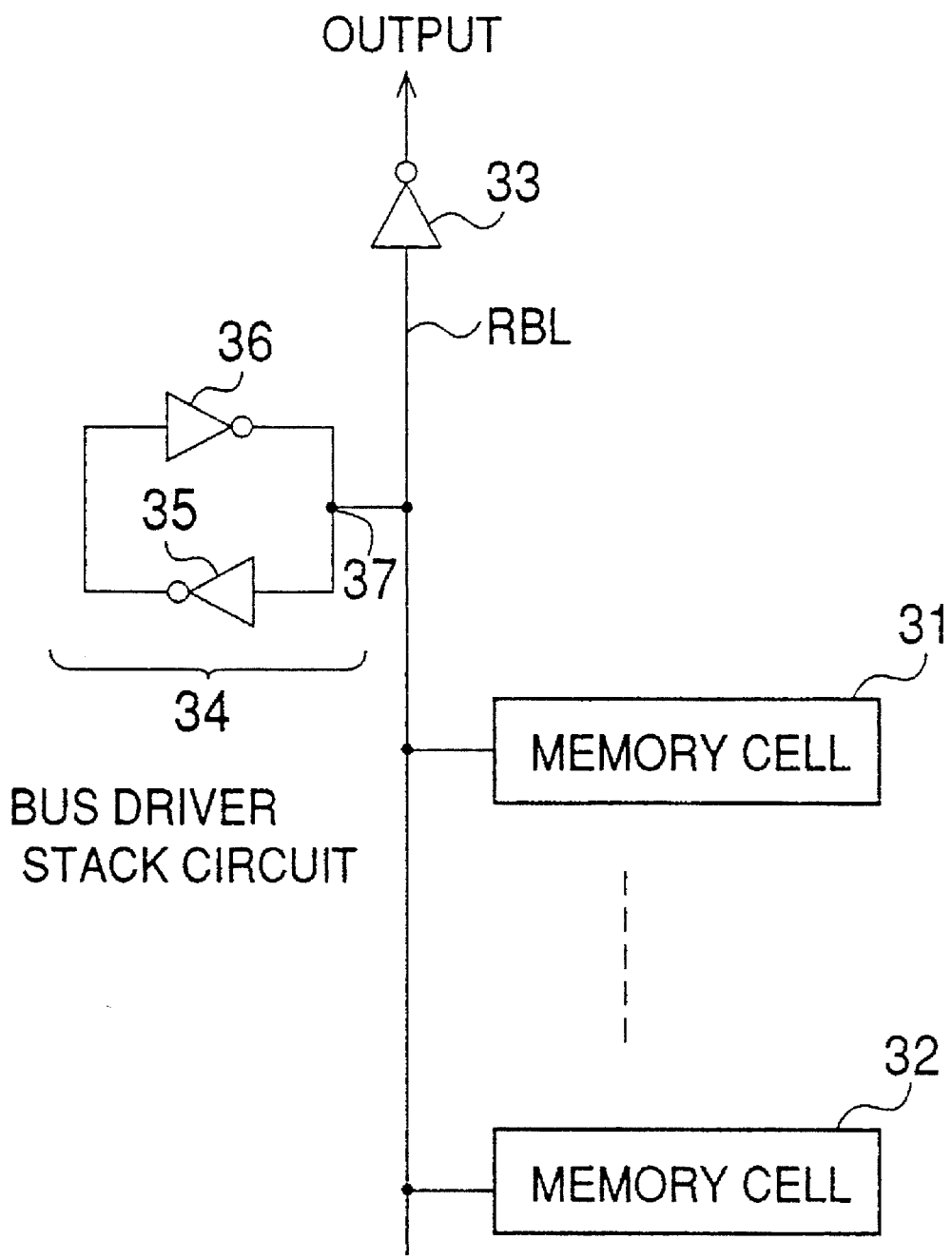
FIG. 7 is a circuit diagram illustrating a circuit having a bit line RBL to which a bus driver stack circuit is connected.
Figure 8:
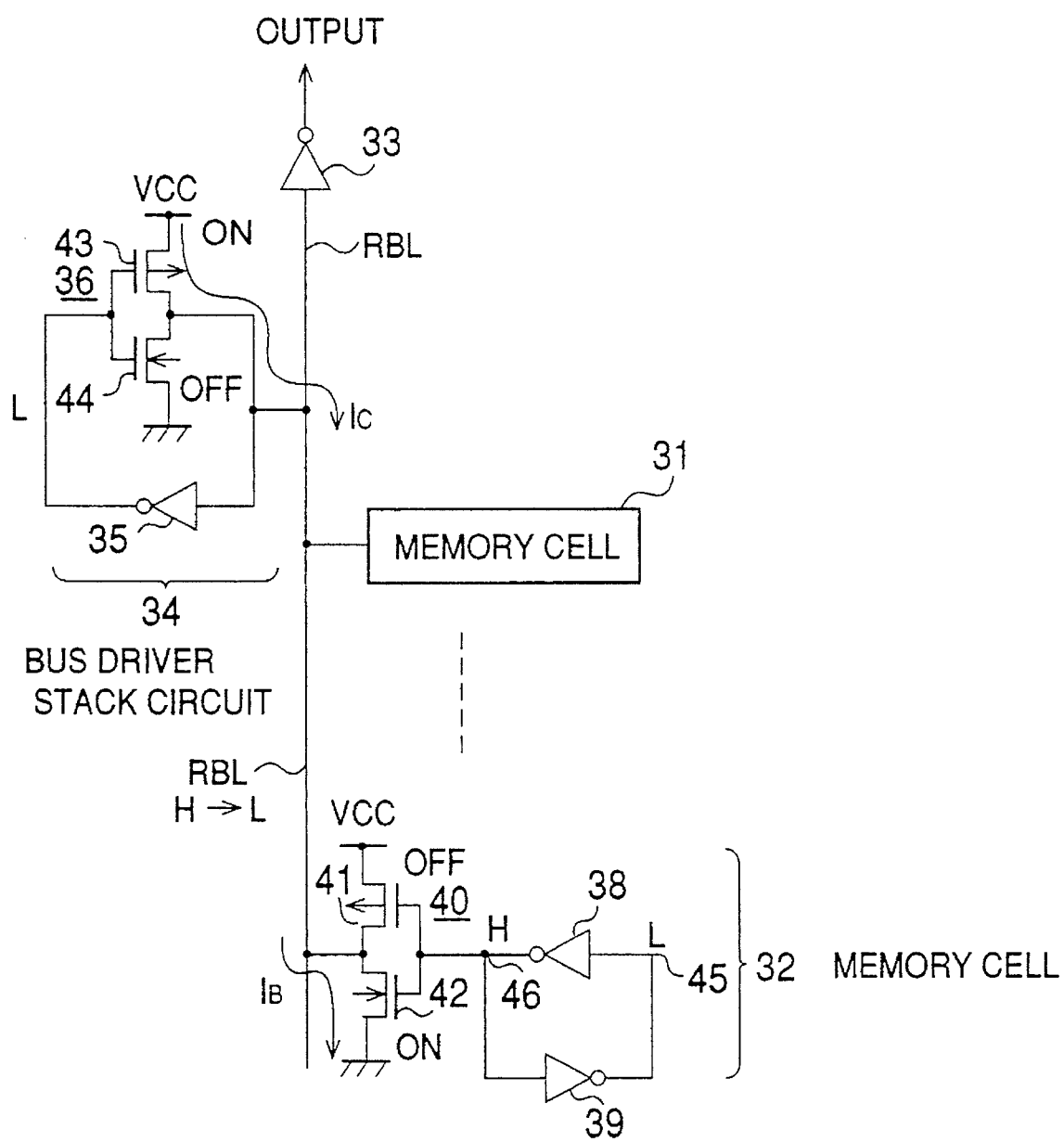
FIGS. 8 and 9 are circuit diagrams illustrating problems of the circuit shown in FIG. 7.
Figure 9:
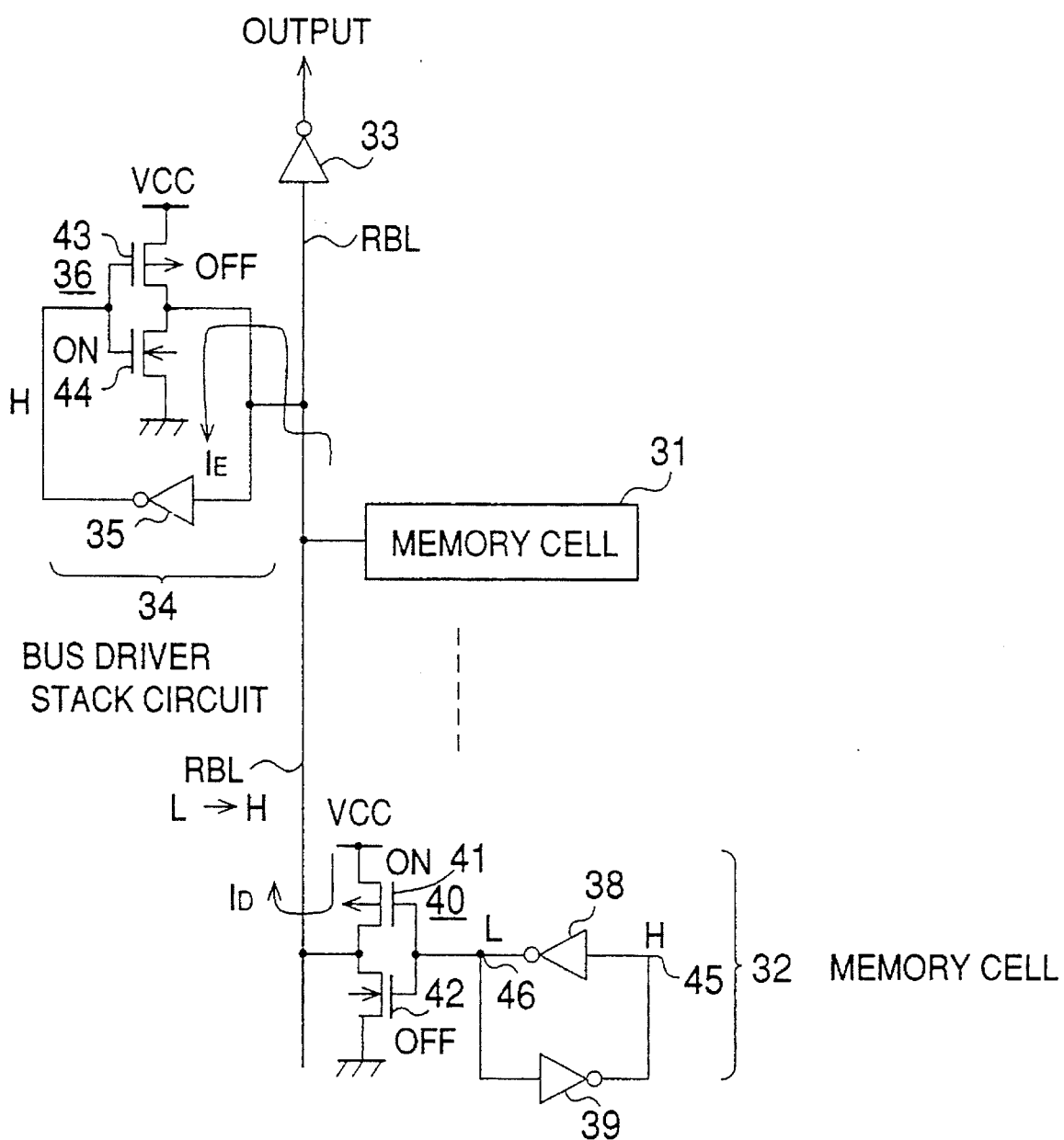

Each of the memory cells 81–116 are formed in the same manner as those shown in FIG. 2, and a reading word line, writing word lines and a bit line respectively corresponding to the reading word line /RWL, the writing word lines WWL and /WWL and the writing bit line WBL shown in FIG. 2 are omitted from FIGS. 12 and 13.

The row decoder 53 shown in FIG. 12 has NAND circuits 117–120, inverters 121–124, and buffer circuits 125–128. The inverters 121–124 respectively invert output signals from the NAND circuits 117–120. The buffer circuits 125–128 respectively drive the reading word lines $RWL_{11}$–$RWL_{14}$. The row decoder 54 shown in FIG. 13 has NAND circuit 129–132, inverters 133–136, and buffer circuits 137–140. The inverters 133–136 respectively invert output signals from the NAND circuits 129–132. The buffers circuits 137–140 respectively drive the reading word lines $RWL_{21}$–$RWL_{24}$. The row decoder 55 shown in FIG. 13 has a NAND circuit 141, an inverter 142 for inverting an output signal from the NAND circuit 141 and a buffer circuit 143 for driving the reading word line $RWL_{31}$.

The block decoder 56 shown in FIG. 12 has a NAND circuit 144, an inverter 145 for inverting an output signal from the NAND circuit 144, and a buffer circuit 146 for outputting a block selecting signal BSL1. The block decoder 57 shown in FIG. 13 has a NAND circuit 147, an inverter 148 for inverting an output signal from the NAND 147 and a buffer circuit 149 for outputting a block selecting signal BSL2. The block decoder 58 shown in FIG.13 has a NAND circuit 150, an inverter 151 for inverting an output signal from the NAND circuit 15 and a buffer circuit 152 for outputting a block selecting signal BSL3.

The block sense amplifier 59 shown in FIG. 12 has buffer circuits 153–156 which are controlled by the block selecting signal BSL1 output from the block decoder 56 so as to be either active or inactive. The block sense amplifier 60 shown in FIG. 13 has buffer circuits 157–160 which are controlled by the block selecting signal BSL2 output from the block decoder 57 so as to be either active or inactive. The block sense amplifier 61 shown in FIG. 13 has buffer circuits 161–164 which are controlled by the block selecting signal BSL3 output from the block decoder 58 so as to be either active or inactive.

Figure 14:
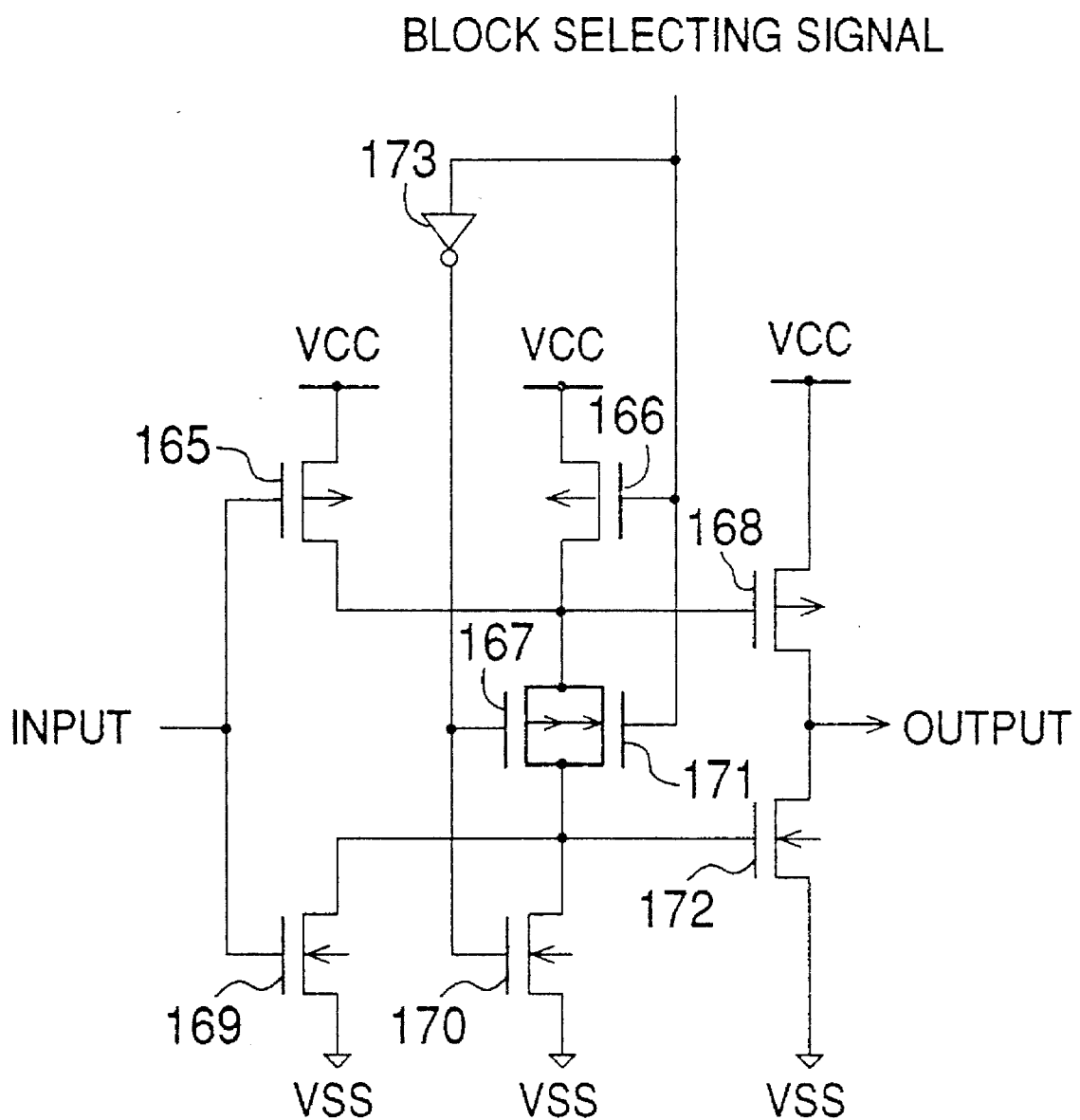
FIG. 14 is a circuit diagram illustrating a buffer circuit forming a block sense amplifier.

Each of the buffer circuits 153–164 is formed as shown in FIG. 14.

Figure 15:
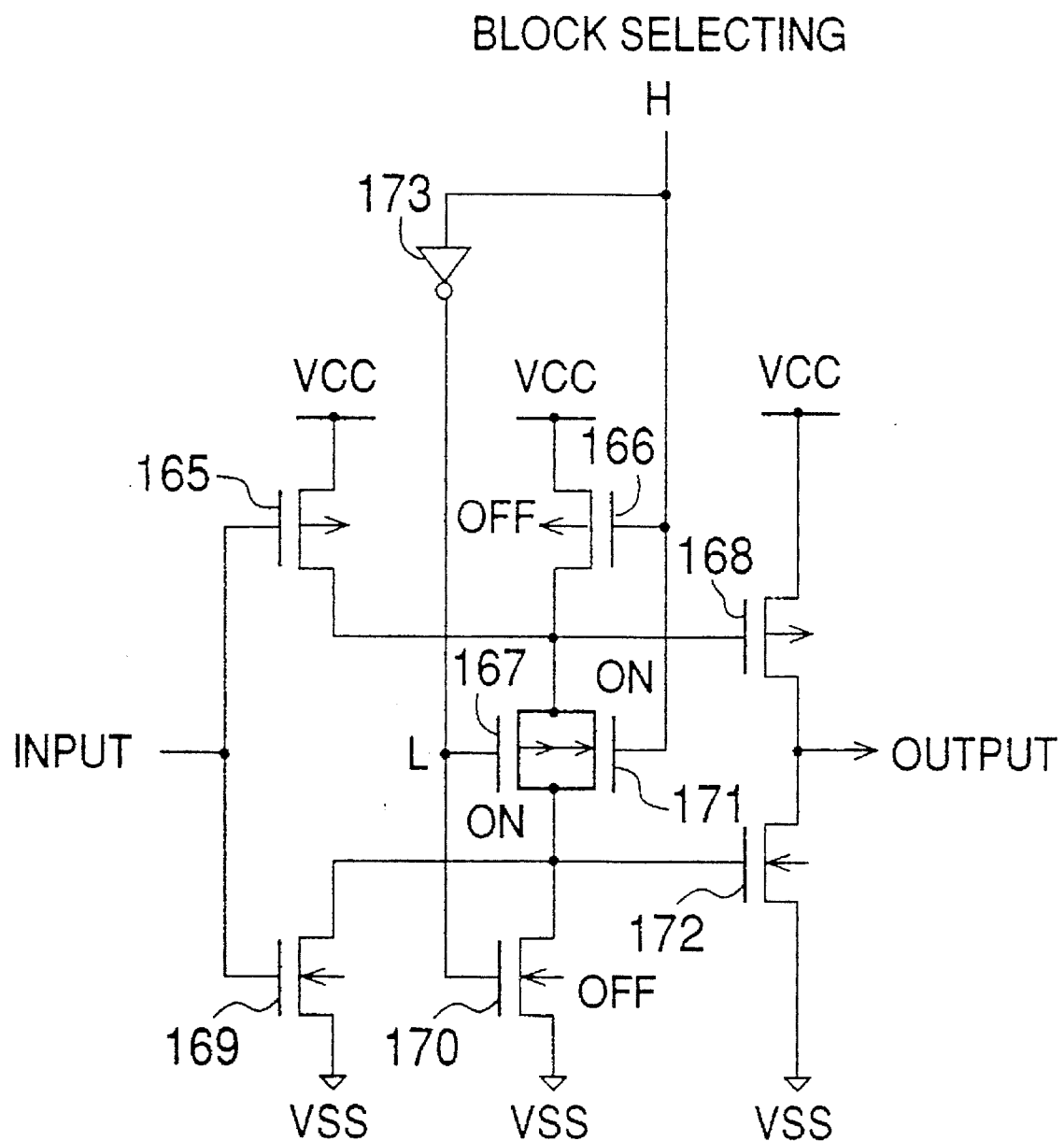
FIG. 15 is a circuit diagram illustrating an operation of the buffer circuit forming the block sense amplifier.
Figure 16:
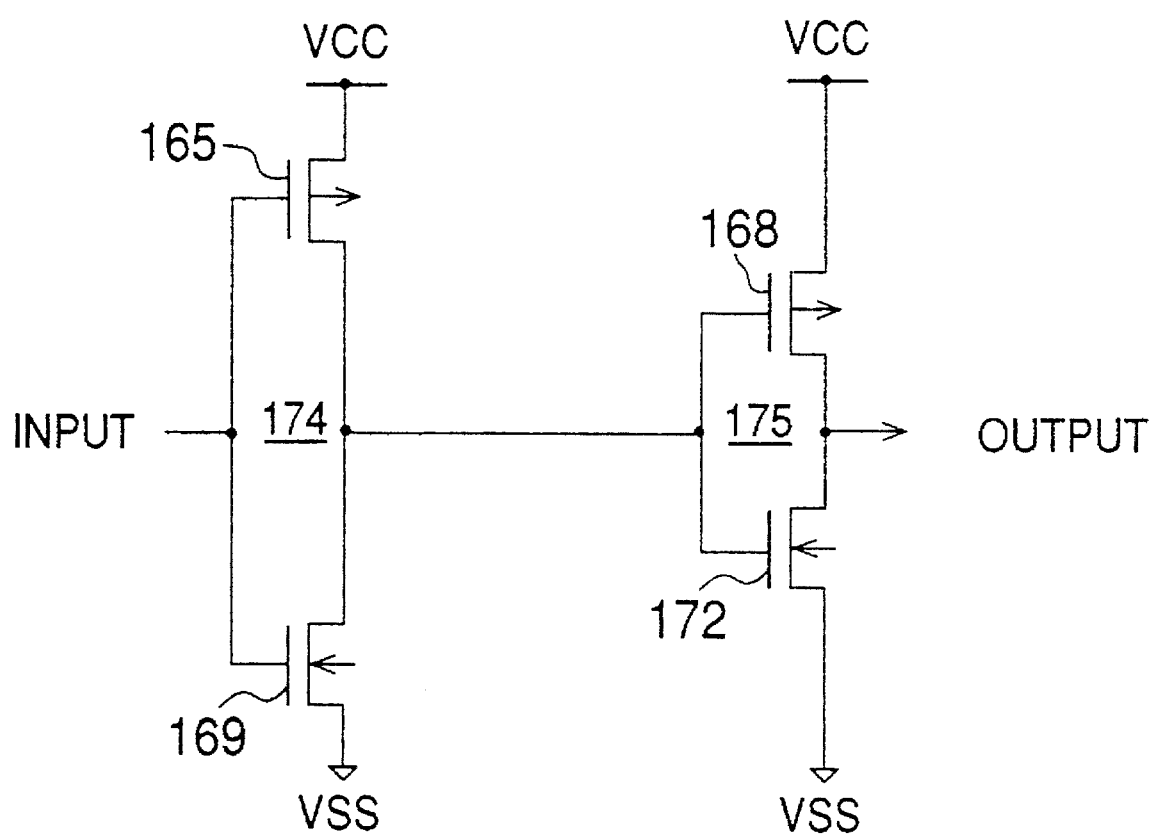
FIG. 16 is an equivalent circuit diagram illustrating the buffer circuit forming the block sense amplifier when activated.
Figure 17:
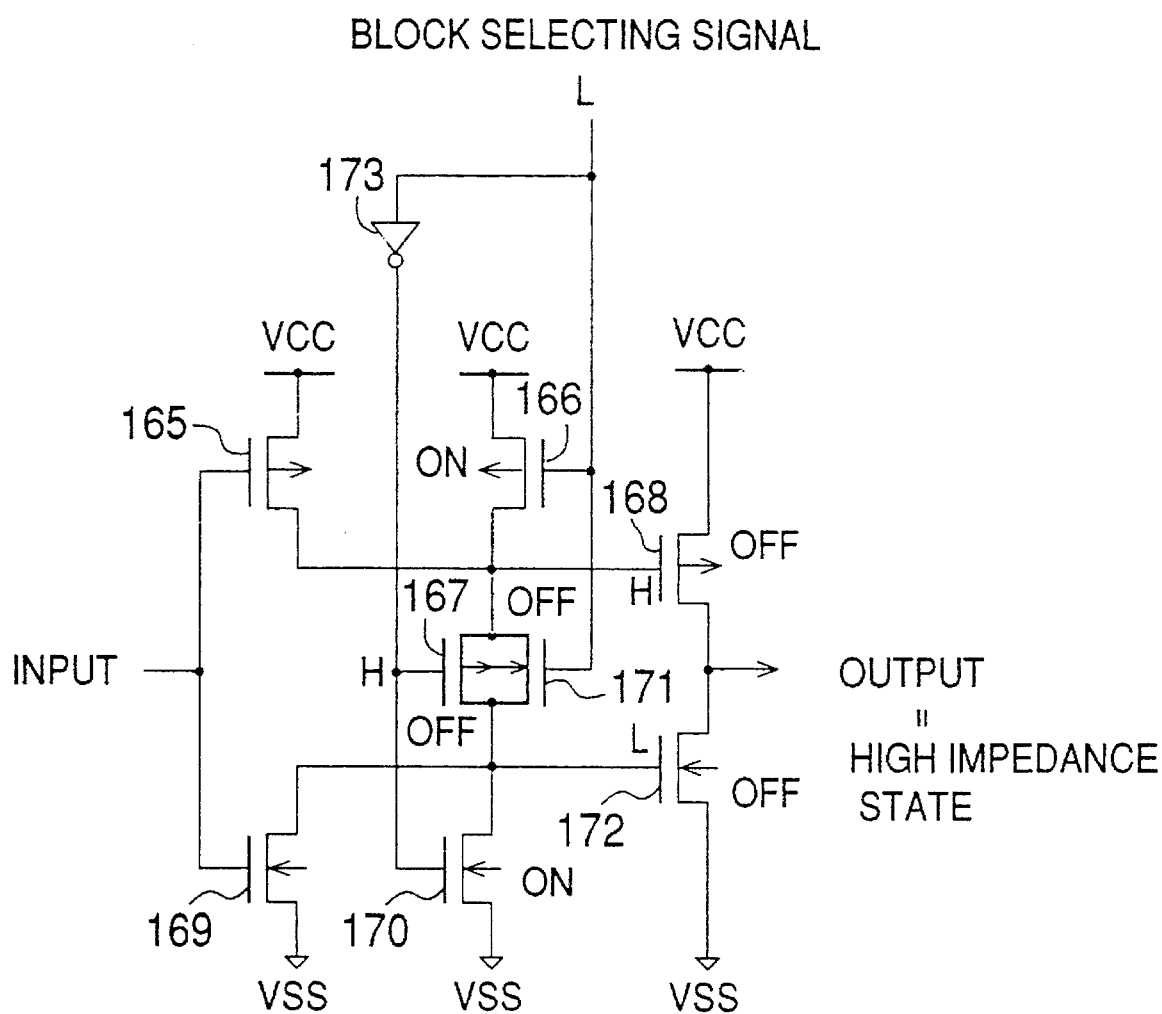
FIG. 17 is a circuit diagram illustrating an operation of the buffer circuit forming the block sense amplifier.

Referring to FIG. 14, each of the buffer circuits 153–164 is formed of pMOS transistors 165–168, nMOS transistors 169–172 and an inverter 173. In each of the buffer circuits 153–164, when a block selecting signal having the high level "H" is supplied thereto, as shown in FIG. 15, the pMOS transistor 166 is in the off state (OFF), the nMOS transistor 171 is in the on state (ON), the output signal of the inverter 173 has the low level "L" the pMOS transistor 167 is in the on state (ON) and the nMOS transistor 170 is in the off state (OFF). As a result, the buffer circuit shown in FIG. 14 is equivalently formed as shown in FIG. 16. That is, the pMOS transistor 165 and the nMOS transistor 169 form an inverter 174, and the pMOS transistor 168 and the nMOS transistor 172 form an inverter 175.

On the other hand, when a block selecting signal having the low level "U" is supplied to the buffer circuit, the pMOS 166 is in the on state (ON), the nMOS transistor 171 is in the off state (OFF), the output signal of the inverter 173 has the high level "H" the pMOS transistor 167 is in the off state (OFF), and the nMOS transistor 170 is in the on state (ON). As a result, the gate of the pMOS transistor 168 is at the high level "H" so that the pMOS transistor 168 is in the off state (OFF), the gate of the nMOS transistor 172 is at the low level "L" so that the nMOS transistor 172 is in the off state (OFF), and the output of the buffer circuit is in a high impedance state.

The block bus driver stack circuit 62 shown in FIG. 13 has inverters 176–179 and buffer circuits 180–183 which are controlled by the block bus driver stack control signal BCL to be either active or inactive. All the inverters 176–179 and the buffer circuits 180–183 have the same structure, and a one bit part of the block bus driver stack circuit 62 is formed as shown in FIG. 18.

Figure 18:
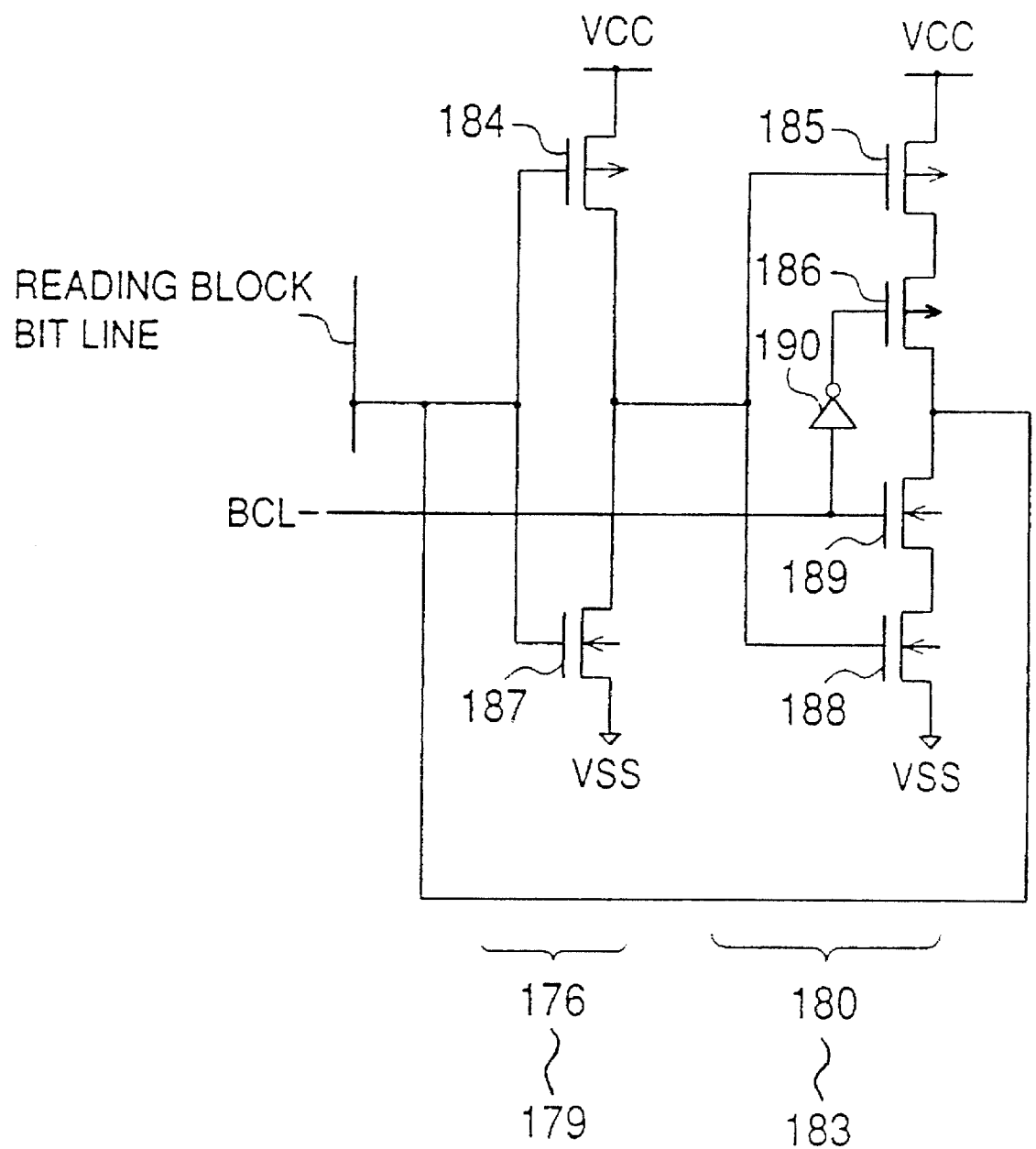
FIG. 18 is a circuit diagram illustrating a one bit structure of a block bus driver stack circuit.
Figure 19:
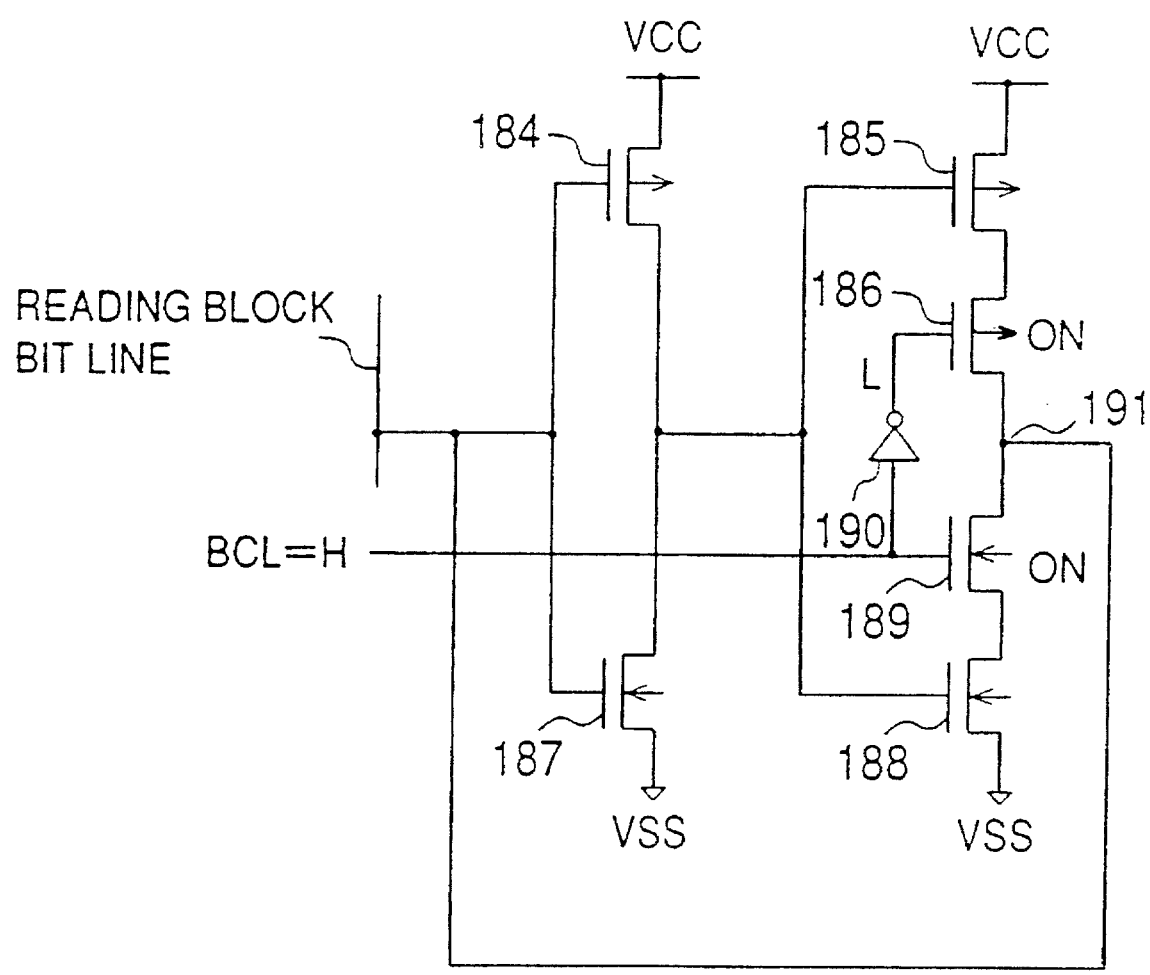
FIG. 19 is a circuit diagram illustrating an operation of the one bit structure of the block bus driver stack circuit.
Figure 20:
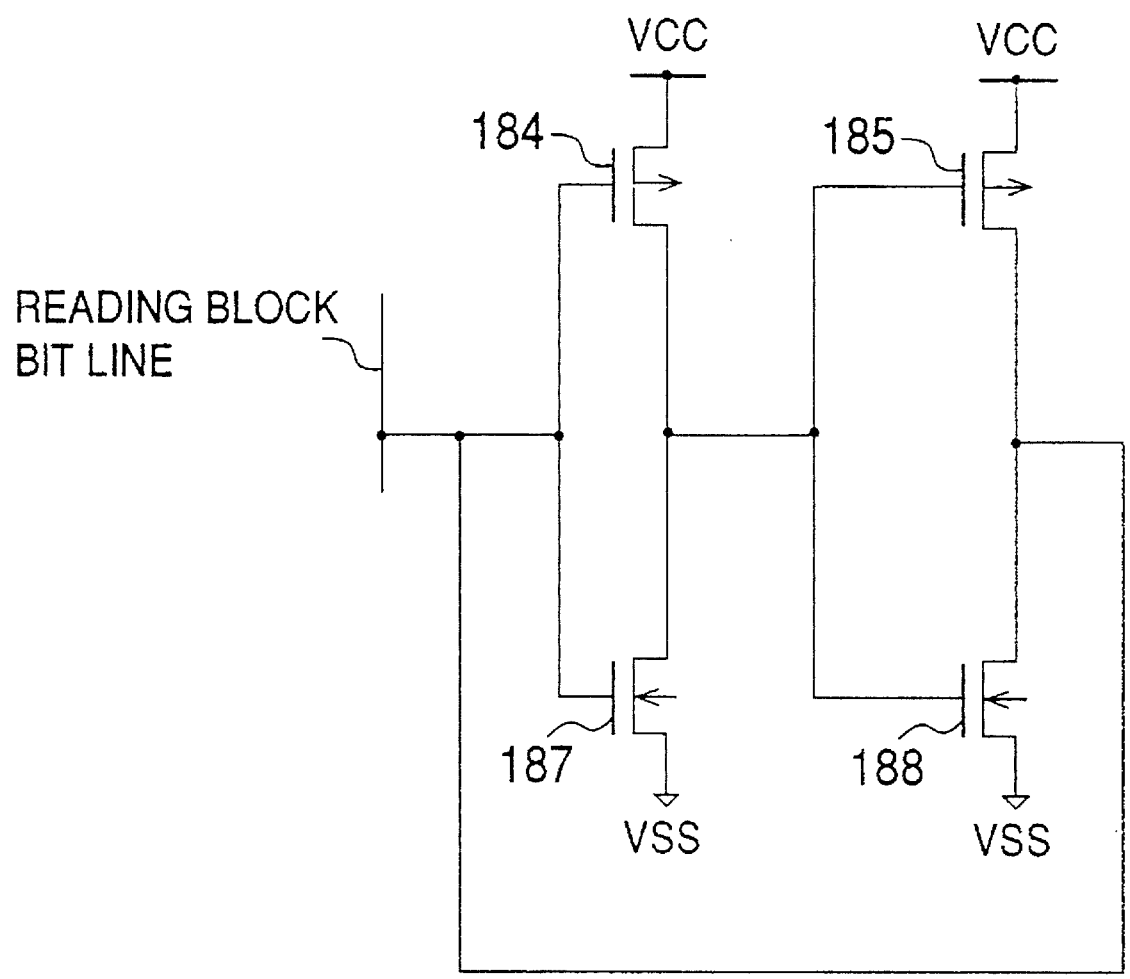
FIG. 20 is a circuit diagram illustrating an equivalent circuit of the one bit structure of the block bus driver stack circuit when activated.

Referring to FIG. 18, the one bit part of the block bus driver stack circuit 62 is formed of pMOS transistors 184–186, nMOS transistors 187–189 and an inverter 190. When the block bus driver stack control signal BCL has the high level "H", as shown in FIG. 19, the pMOS transistor 186 is turned on (ON), the output signal of the inverter 190 has the low level "U" and the pMOS transistor 186 is turned on (ON), so that the one bit part of the block bus driver stack circuit 62 is equivalently activated as shown in FIG. 20.

Figure 21:
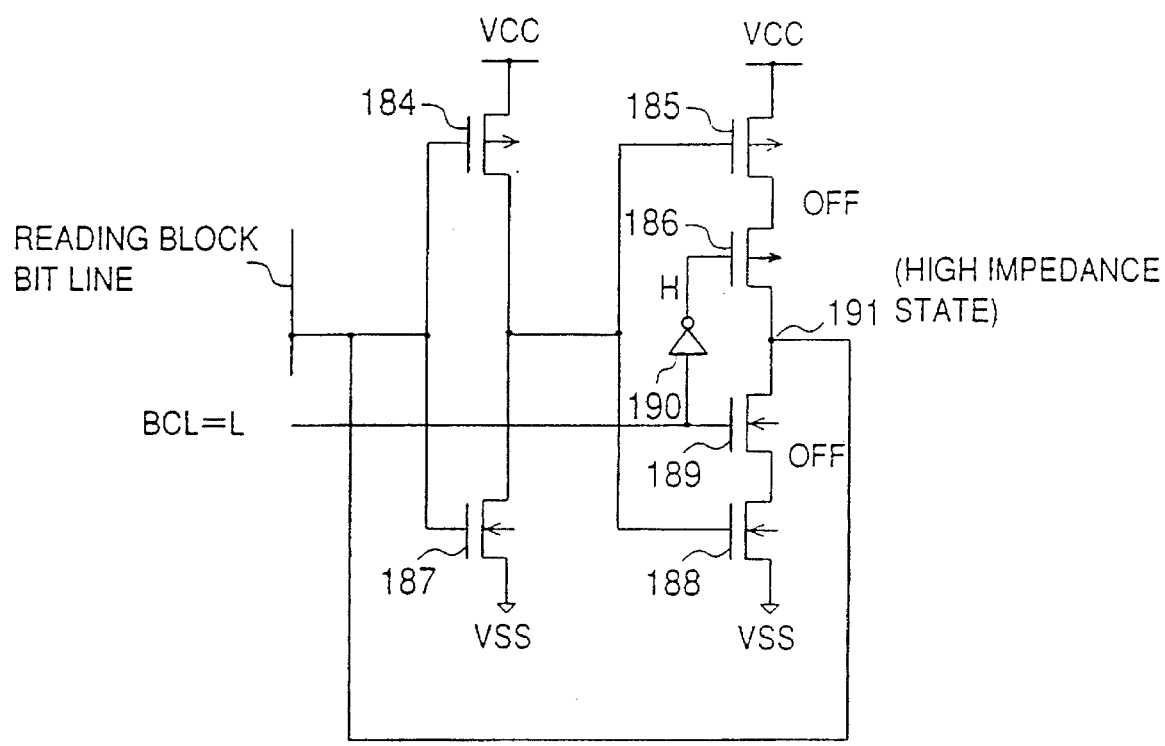
FIG. 21 is a circuit diagram illustrating an operation of the one bit structure of the block bus driver stack circuit.

On the other hand, when the block driver stack control signal BCL has the low level "L", as shown in FIG. 21, the nMOS transistor 189 is turned off (OFF), the output signal from the inverter 190 has the high level "H" and the pMOS transistor 186 is in the off state (OFF). As a result, a node 191 shown in FIG. 21 is in a high impedance state.

In the present embodiment, the row address signal is formed of two bits A2 and A3, so that the row address signal can identify a row address among four addresses. Each of the memory cell blocks 48 and 49 is provided with four row addresses corresponding to the row address signal. As a result, the block bit lines $RBL_{11}$–$RBL_{14}$ and $RBL_{21}$–$RBL_{24}$ of the memory cell blocks 48 and 49 are not usually in the floating state in the reading operation. Thus, the memory cell blocks 48 and 49 are provided with no block bus driver stack circuit.

The main sense amplifier 64 shown in FIG. 12 has buffer circuits 192–195 which are controlled by the column selecting signal (A1 and /A1) so as to be either active or inactive. Each of the buffer circuits 192–195 is formed in the same manner as each of those forming the block sense amplifiers 59–61 shown in FIG. 14. In this case, the column selecting signal substituted for the block selecting signal is supplied, as a control signal, to the buffer circuit.

The main bus driver stack circuit 65 shown in FIG. 12 has inverters 196–199 and buffer circuits 200–203 which are controlled by the main bus driver stack circuit control signal MCL so as to be either active or inactive. All the inverters 196–199 and the buffer circuits 200–203 have the same structure, and the one bit part of the main bus driver stack circuit 65 is formed in the same manner as that of the block bus driver stack circuit 62 shown in FIG. 18. In this case, the main bus driver stack control signal MCL substituted for the block bus driver stack control signal BCL is supplied, as a control signal, to the one bit part of the main bus driver stack circuit 65.

Figure 22:
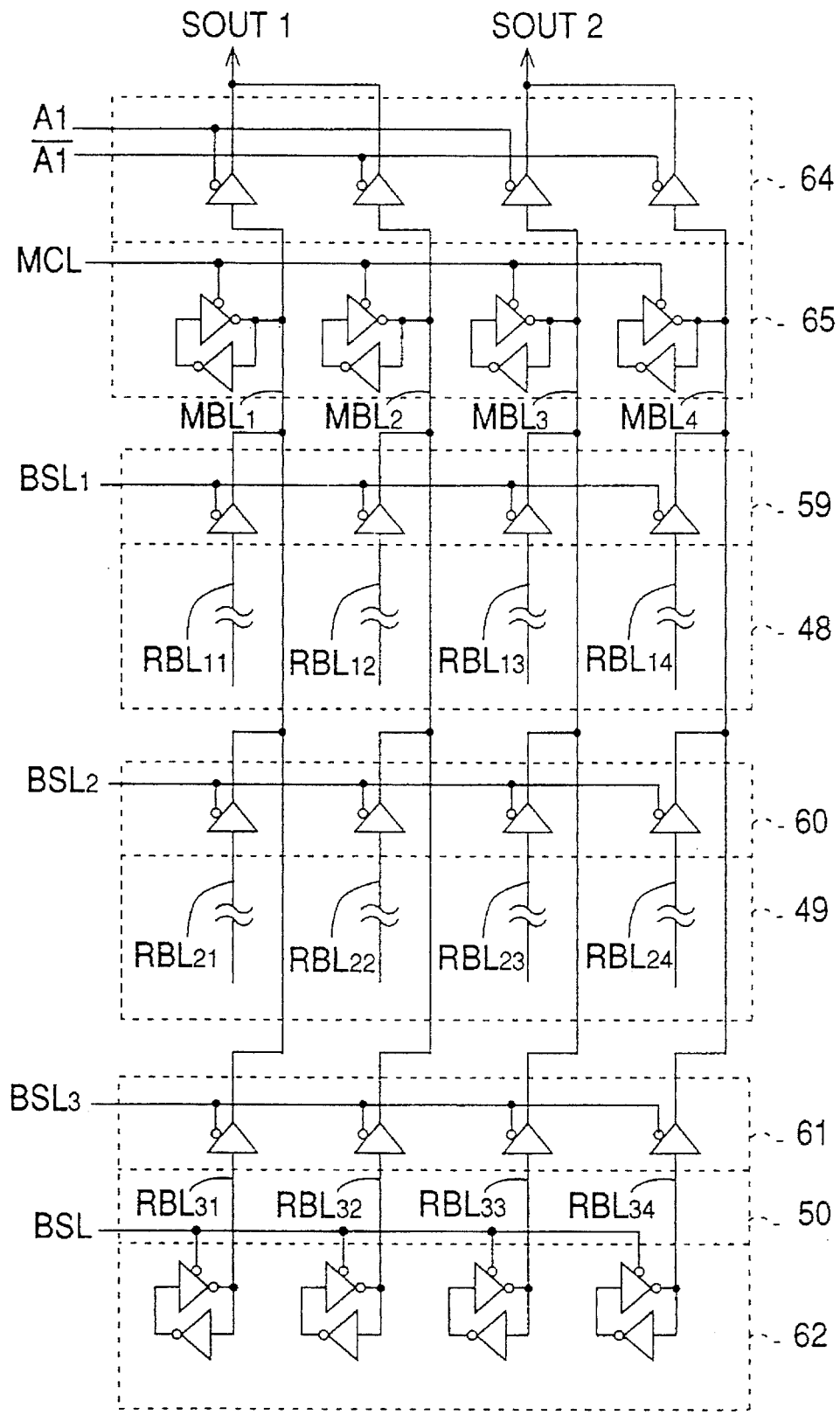
FIG. 22 is a circuit diagram illustrating relationships between reading block bit lines and reading main bit lines.

FIG. 22 shows the relationships between the reading block bit lines $RBL_{11}$–$RBL_{14}$, $RBL_{21}$–$RBL_{24}$ and $RBL_{31}$–$RBL_{34}$ and the main bit lines $MBL_1$–$MBL_4$.

Figure 23:
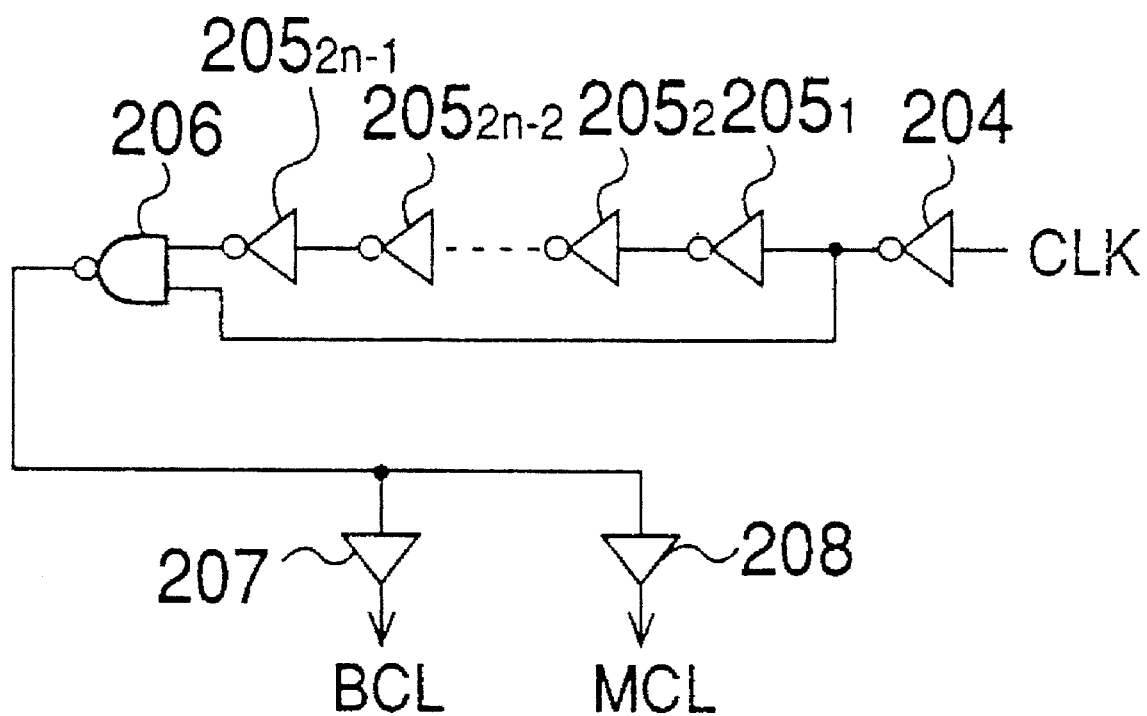
FIG. 23 is a circuit diagram illustrating a part of a pulse generator.

The pulse generator 71 is formed as shown in FIG. 23. Referring to FIG. 23, the pulse generator 71 has inverters 204, $205_1$, $205_2$, ..., $205_{2n-2}$ and $2052_{n-1}$ which are serially connected, a NAND circuit 206, and buffer circuits 207 and 208. The clock signal is supplied to the inverter 204, and the outputs of the inverters 204 and $205_{2n-1}$ are connected to the input terminals of the NAND circuit 206. Pulses, each having a width corresponding to a delay time depending on the number of the inverters $205_1$–$205_{2n-1}$, are output from the NAND circuit 206. The buffer circuits 207 and 208 are connected to the output of the NAND circuit 206, the block bus driver stack control signal BCL is output from the buffer circuit 207, and the main bus driver stack control signal MCL is output from the buffer circuit 208.

Figure 24:
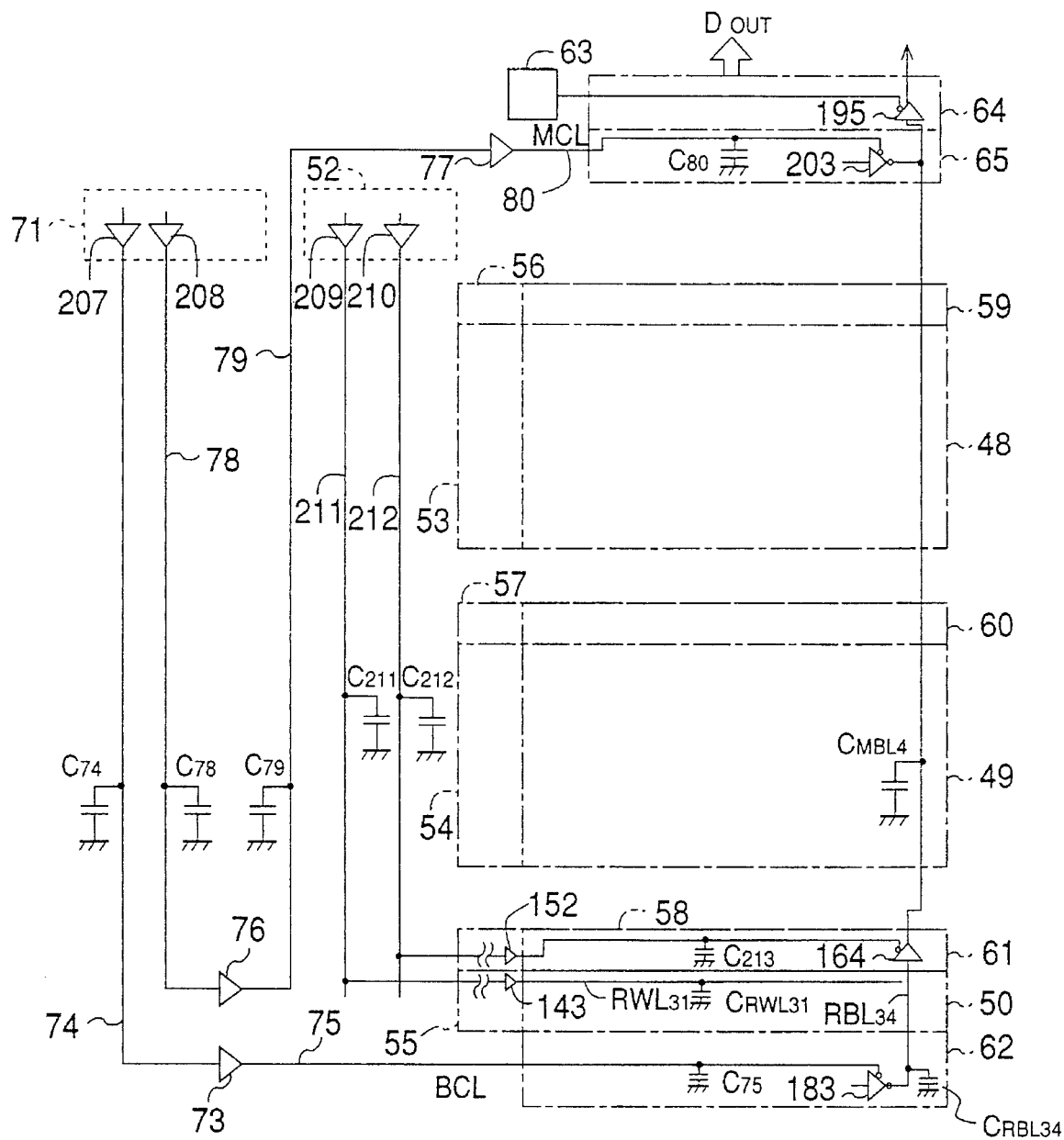
FIG. 24 is a circuit diagram illustrating block bus driver stack control signal BCL and a main bus driver stack control signal MCL.

FIG. 24 shows wiring for the block bus driver stack control signal BCL to be supplied to the block bus driver stack circuit 62 and for the main bus driver stack control signal MCL to be supplied to the main bus driver stack circuit 65.

Referring to FIG. 24, the block bus driver stack control signal line 74 between the pulse generator 71 and the block control buffer 73 has a wiring capacitance $C_{74}$, and the block bus driver stack control signal line 75 between the block control buffer 73 and the block bus driver stack circuit 62 has a wiring capacitance $C_{75}$. In addition, the main bus driver stack control signal line 78 between the pulse generator 71 and the main control buffer 76 has a wiring capacitance $C_{78}$, the main bus driver stack control signal line 79 between the main control buffers 76 and 77 has a wiring capacitance $C_{79}$, and the main bus driver stack control signal line 80 between the main control buffer 77 and the main bus driver stack circuit 65 has a wiring capacitance $C_{80}$.

The pre-coder 52 has buffer circuits 209 and 210. A row address line 211 is connected to the buffer circuit 209 and has a wiring capacitance $C_{211}$. A block address signal line 212 is connected to the buffer circuit 210 and has a wiring capacitance $C_{212}$. In addition, the word line $RWL_{31}$ has a wiring capacitance $C_{RWL31}$, and a block selecting signal line 213 in the block sense amplifier 61 has a wiring capacitance $C_{213}$. The main bit line MBL4 has a wiring capacitance $C_{MBL4}$, and the block bit line $RBL_{34}$ has a wiring capacitance $C_{RBL34}$.

In the SRAM according to the present embodiment, when a selected reading word line is controlled so as to be at the high level "H", the block bus driver stack control signal BCL supplied to the block bus driver stack circuit 62 is maintained at the low level in a period including a time at which data is read out to the reading block bit line (see FIG. 25 (C), (D) and (E)). The timing at which the block bus driver stack control signal BCL generated by the pulse generator 71 reaches the block bus driver stack circuit 62 is adjusted by the wiring in the SRAM so that the block bus driver stack circuit 62 is inactive (that is, the input/output node of the block bus driver stack circuit 62 is in the high impedance state) in this period. Thus, the buffer circuit 207 of the pulse generator 71 is located in the SRAM so that k207=k209, $C_{74}=C_{211}$, k73=k143 and $C_{RWL31}=C_{75}$, where k207, k209, k73 and k143 are respectively dependency coefficients of the buffer circuit 207 of the pulse generator 71, the buffer circuit 209 of the pre-coder 52, the block control buffer 73 and the buffer circuit 143 of the row decoder 55. Each of the dependency coefficients represents how much the delay time depends on a load capacitance of a corresponding circuit.

In addition, the main bus driver stack control signal MCL is maintained at the low level in a period including a time at which the data read out to the reading block bit line in a selected memory cell block is transmitted to the main bit lines MBL1–MBL4 via a corresponding block sense amplifier (see FIG. 25 (F) and (G)). The timing at which main bus driver stack control signal MCL generated by the pulse generator 71 reaches the main bus driver stack circuit 65 is adjusted by the wiring in the SRAM so that the main bus driver stack circuit 65 is inactive (that is, the input/output node of the main bus driver stack circuit 65 is in the high impedance state) in this period. Thus, the main control buffer circuits 76 and 77 are located in the SRAM so that k208= k210, $C_{78}=C_{212}$, k76=k164, $C_{79}=C_{MBL4}$, K77=K152 and $C_{80}=C_{213}$, where k208, k210, k76, k164, k77, and k152 are respectively dependency coefficients of the buffer circuit 208 of the pulse generator 71, the buffer circuit 210 of the pre-coder 52, the main control buffer 76, the buffer circuit 164 of the block sense amplifier 61, the main control buffer 77 and the buffer circuit 152 of the block decoder 58.

Signals in the SRAM vary as shown in FIG. 25.

FIG. 25 (A) shows the clock signal CLK supplied from an external unit. FIG. 25 (B) shows the output (the address signal A5, /A5–A2, /A2) of the pre-decoder 52. FIG. 26(C) shows a potential of a selected reading word line RWL. FIG. 25 (D) shows potentials of the reading block bit lines $RBL_{11}$–$RBL_{14}$, $RBL_{21}$–$RBL_{24}$ and $RBL_{31}$–$RBL_{34}$. FIG. 25 (E) shows the block bus driver stack control signal BCL in the block bus driver stack circuit 62. FIG. 25 (F) shows potentials of the main bit lines MBL1–MBL4. FIG. 25 (G) shows the main bus driver stack control signal MCL in the main bus driver stack circuit 65.

In the SRAM according to the present embodiment, when the clock signal CLK supplied from the external unit has the high level "H", an address signal A1–A5 is received by the address register 51. When the level of the clock signal CLK is inverted from the high level "H" to the low level "L", the pulse generator 71 generates the block bus driver stack control signal BCL and the main bus driver stack control signal MCL. When the clock signal CLK is maintained at the low level "L" the address signal A5–A2 stored in the address register 51 is read out, a column address signal A1 is decoded by the column decoder 63, and a buffer circuit corresponding to the selected column (the main bit line) among the buffer circuits 192–195 of the main sense amplifier 64 is activated. In addition, after a row address signal (A2 and A3) is decoded by the pre-decoder 52, the decoded row address is further decoded by the row decoders 53–55. A reading word line identified by the selected row address, among the reading word lines $RWL_{11}$–$RWL_{14}$, $RWL_{21}$–RWL24 and $RWL_{31}$–$RWL_{34}$, is controlled at the high level "H". After a block address signal (A4 and A5) is decoded by the pre-decoder 52, the decoded block address signal is further decoded by the block decoder 56–58. A block sense amplifier corresponding to the selected memory cell block, among the block sense amplifiers 59–61, is activated.

Only data read out to a reading block bit line of the selected memory cell block, among the reading block bit lines, is transmitted to the main bit lines MBL1–MBL4 via a corresponding block sense amplifier, and further transmitted to the output data buffer 66 via the main sense amplifier 66.

In the present embodiment, the block bus driver stack control signal BCL is controlled so as to be at the low level "L" in a period of time including when data in the memory cells 113–116 is read out to the block bit lines $RBL_{31}$–$RBL_{34}$ (see FIG. 25 (D) and (E)). The block bus driver stack circuit 62 is inactive in this period. After the data in the memory cells 113–116 is read out to the block bit lines $RBL_{31}$–$RBL_{34}$, the block bus driver stack control signal BCL is controlled so as to be at the high level "H" (see FIG. 25 (D) and (E)). Thus, at this time, the block bus driver stack circuit 62 is activated. Potential levels of the reading bit lines $RBL_{31}$–$RBL_{34}$ are maintained at values corresponding to the read data by the block bus driver stack circuit 62.

As a result, even if the memory cell 50 is selected next, and a row address signal identifying a row address which does not exist in the memory cell 50 is supplied thereto, the through current does not flow through the buffer circuits 161–164 of the block sense amplifier 61.

In addition, the block bus driver stack control signal BCL supplied to the bus driver stack circuit 62 is controlled so as to be at the low level "L" in a period including a time at which the selected reading word line is controlled so as to be at the high level "H" and the data is read out to the reading block bit line (see FIG. 25 (C), (D) and (E)). In this period, the block driver stack circuit 62 is inactive. That is, the input/output node is in the high impedance state. As a result, even if data having a potential level opposite to the potential level at which the block bit lines $RBL_{31}$–$RBL_{34}$ is maintained is read out, no current flows from buffer circuits 180–183 of the block bus driver stack circuit 62 to the block bit lines $rBL_{31}$–$RBL_{34}$, and vice versa.

According to the present embodiment, a time needed to invert the potential level of the reading block bit lines $RBL_{31}$–$RBL_{34}$ is not increased, so that the reading operation in the SRAM can be carried out at a high speed.

In this case, the output potential level of the memory cell exceeds the output potential level of each of the buffer circuits 180–183 of the block bus driver stack circuit 62, so that it is not necessary to satisfy the threshold voltage condition of the buffer circuits 161–164 of the block sense amplifier 61. Thus, the margin of the production process conditions of the SRAM and the operating margin of the SRAM with respect to the power voltage can be improved.

In addition, in the present embodiment, the main bus driver stack control signal MCL is controlled so as to be at the low level "L" in a period including a time at which data in the memory cells 113–116 is read out to the main bit lines MBL1–MBL4 (see FIG. 25 (F) and (G)). In this period, the main bus driver stack circuit 65 is inactive. After the data in the memory cells 113–116 is transmitted to the main bit lines MBL1–MBL4, the main bus driver stack control signal MCL is controlled so as to be at the high level "H" (see FIG. 25 (F) and (G)). Thus, at this time, the main bus driver stack circuit 65 is activated, and the potential level of the reading main bit lines MBL1–MBL4 is maintained, by the main bus driver stack circuit 65, at a value corresponding to the read data. As a result, even if a block address signal identifying a block address which selects none of the memory cell blocks 48, 49 and 50 is supplied to the SRAM, the through current does not flow through the buffer circuits 192–195 of the main sense amplifier 64.

Furthermore, in the present embodiment, the main bus driver stack control signal MCL is controlled so as to be at the low level "L" in a period including a time at which data read out to the reading bit line of the selected memory cell is transmitted to the main bit lines MBL1–MBL4 via a corresponding block sense amplifier (see FIG. 25 (F) and (G)). In this period, the main bus driver stack circuit is inactive, that is, the input/output node of the main bus driver stack circuit 65 is in the high impedance state. As a result, even if data having a potential level opposite to the potential level at which the main bit lines MBL1–MBL4 are maintained, is transmitted to the main bit lines MBL1–MBL4, no current flows from buffer circuits 200–203 of the main bus driver stack circuit 65 to the main bit lines MBL1–MBL4, and vice versa.

Thus, according to the present embodiment, a time needed to invert the potential level of the main bus driver stack circuit 65 is not increased. Thus, the reading operation can be carried out at a high speed.

In this case, the output potential level of block bit lines $RBL_{11}$–$RBL_{14}$, $RBL_{21}$–$RBL_{24}$ or $RBL_{31}$–$RBL_{34}$ exceeds the potential level of the buffer circuits 200–203 of the main bus driver stack circuit 65, so that it is not necessary to satisfy the threshold voltage condition of the buffer circuits 192–195 of the main sense amplifier 64. Thus, the margins of the production process conditions of the SRAM and the operating margin of the SRAM with respect to the power voltage can be improved.

The present invention is not limited to the aforementioned embodiments, and variations and modifications may be made without departing from the scope of the claimed invention.

What is claimed is:

1. A semiconductor storage device comprising:
    a plurality of memory cells;
    a selection circuit which selects, in accordance with address information, a memory cell from among said plurality of memory cells;
    a data line to which said plurality of memory cells are coupled, data read out from the memory cell selected by said selection circuit being received by, and transmitted through, said data line;
    an amplifier, coupled to said data line, for amplifying the data transmitted through said data line;
    a latching circuit, coupled to said data line, which latches a potential level of data which has been supplied to said data line; and
    a control circuit, coupled to said latching circuit, which controls said latching circuit so that said latching circuit is inactive for a period of time which includes when said data line receives data read out from the respective memory cell selected by said selection circuit.

2. The semiconductor storage device as claimed in claim 1, wherein said data line is able to be in a floating state when a memory cell identified by the address information is not present in said plurality of memory cells, and said amplifier is a sense amplifier through which a current flows if the data line is in the floating state.

3. The semiconductor storage device as claimed in claim 2, wherein said sense amplifier includes a CMOS inverter.

4. The semiconductor storage device as claimed in claim 1, wherein said latching circuit comprises a circuit, formed of an even number of inverters which are connected cyclically, having an input/output node connected to said data line.

5. The semiconductor storage device as claimed in claim 1, wherein said control circuit comprises a signal generating circuit which generates a control signal based on a clock signal supplied from an external unit, and a signal supplying circuit which supplies the control signal to said latching circuit, so that said latching circuit is controlled based on said control signal.

6. The semiconductor storage device as claimed in claim 4, wherein said control circuit comprises a signal generating circuit which generates a control signal based on a clock signal supplied from an external unit, and a signal supplying circuit which supplies the control signal to said latching circuit, so that the input/output node of said latching circuit is controlled by said control signal to be in a high impedance state in the period of time when said control circuit controls said latching circuit to be inactive.

7. The semiconductor storage device as claimed in claim 5, wherein said signal supplying circuit has a transmission line through which the control signal is transmitted to said latching circuit, a timing at which the control signal reaches said latching circuit being controlled by a wiring capacitance of said transmission line so that said latching circuit is inactive in the period of time in which said control circuit controls said latching circuit to be inactive.

8. The semiconductor storage device as claimed in claim 6, wherein said signal supplying circuit has a transmission line through which the control signal is transmitted to said latching circuit, a timing at which the control signal reaches said latching circuit being controlled by a wiring capacitance of said transmission line so that the input/output node of said latching circuit is in the high impedance state in the period of time in which said control circuit controls said latching circuit to be inactive.

9. A semiconductor storage device comprising:

a plurality of memory cells;

a selection circuit which selects, in accordance with address information supplied from an external unit, memory cells from among said plurality of memory cells;

a plurality of data lines to which said plurality of memory cells are coupled, data read out from the memory cells selected by said selection circuit being received by, and transmitted through said plurality of data lines;

an amplifier, coupled to each of said plurality of data lines, for amplifying the data transmitted through said plurality of data lines;

a latching circuit, coupled to each of said plurality of data lines, which latches a potential level of data which has been supplied to each of said data lines; and a control circuit, coupled to said latching circuit, which controls said latching circuit so that said latching circuit is inactive for a period of time which includes when said data lines receive data read out from memory cells selected by said selection circuit.

10. The semiconductor storage device as claimed in claim 9, wherein said latching circuit includes a first latching circuit and a second latching circuit, said plurality of data lines include first data lines connected to said first latching circuit and second data lines which branch from said first data lines and are connected to said second latching circuit.

11. The semiconductor storage device as claimed in claim 10, wherein said control circuit comprises:

a signal generating circuit which generates a first control signal and a second control signal based on a clock signal supplied from the external unit, a first signal supplying circuit which supplies the first control signal to said first latching circuit to control said first latching circuit by the first control signal, and a second signal supplying circuit which supplies the second control signal to said second latching circuit to control said second latching circuit by said second control signal.

12. The semiconductor storage device as claimed in claim 11, wherein said first signal supplying circuit has a first transmission line through which the first control signal is transmitted to said first latching circuit, a timing at which the first control signal reaches said first latching circuit being controlled by a wiring capacitance of said first transmission line so that said first latching circuit is inactive in the period of time in which said control circuit controls said latching circuit to be inactive.

13. The semiconductor storage device as claimed in claim 12, wherein said second signal supplying circuit has a second transmission line through which the second control signal is transmitted to said second latching circuit, a timing at which the second control signal reaches said second latching circuit being controlled by a wiring capacitance of said second transmission line so that said second latching circuit is inactive in the period of time in which said control circuit controls said latching circuit to be inactive.

14. The semiconductor storage device as claimed in claim 9, wherein said plurality of memory cells are arranged in a matrix of rows and columns and each memory cell of said plurality of memory cells has a corresponding row address indicating a row of the matrix for addressing the respective memory cell, the address information includes row data for selecting a row of the matrix and column data for selecting a column of the matrix, the row data and the column data each comprising a plurality of bits, and the number of row addresses corresponding to said memory cells is less than the number of row addresses representable by the plurality of bits of row data.

* * * * *

UNITED STATES PATENT AND TRADEMARK OFFICE
CERTIFICATE OF CORRECTION

PATENT NO. : 5,517,461
DATED : May 14, 1996
INVENTOR(S) : Kazuyoshi UNNO, et al.

It is certified that error appears in the above-indentified patent and that said Letters Patent is hereby corrected as shown below:

Column 2, lines 37 and 64, delete "U" and insert therefor --L--.
Column 3, line 10, delete "U" and insert therefor --L--.
Column 4, line 58, delete "U" and insert therefor --L--.
Column 5, line 10, delete "U" and insert therefor --L--.
Column 8, line 52, delete "RBL11" and insert therefor --$RBL_{11}$--;
    Line 54, delete "RWL21" and insert therefor --$RWL_{21}$--.
Column 9, line 49, delete "U" and insert therefor --L--.
Column 10, line 7, delete "U" and insert therefor --L--.
Column 12, line 28, delete "RWL24" and insert therefor --$RWL_{24}$--.

Signed and Sealed this

Twentieth Day of August, 1996

Attest:

BRUCE LEHMAN

*Attesting Officer*     *Commissioner of Patents and Trademarks*